US011721523B2

(12) United States Patent
Samuels

(10) Patent No.: US 11,721,523 B2
(45) Date of Patent: Aug. 8, 2023

(54) CONTROL OF RAIL VOLTAGE IN MULTI-LEVEL PULSING RF POWER AMPLIFIER

(71) Applicant: Advanced Energy Industries, Inc., Fort Collins, CO (US)

(72) Inventor: Chad S. Samuels, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 8 days.

(21) Appl. No.: 17/468,412

(22) Filed: Sep. 7, 2021

(65) Prior Publication Data

US 2023/0075152 A1 Mar. 9, 2023

(51) Int. Cl.
*H01J 37/32* (2006.01)
*H03F 3/21* (2006.01)

(52) U.S. Cl.
CPC .......... *H01J 37/32174* (2013.01); *H03F 3/21* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 8,040,068 | B2 | 10/2011 | Coumou | |
| 8,258,874 | B2 | 9/2012 | van Zyl | |
| 8,716,984 | B2 | 5/2014 | Mueller | |
| 8,912,835 | B2 | 12/2014 | Nagarkatti | |
| 9,225,299 | B2 | 12/2015 | van Zyl | |
| 9,721,758 | B2 | 8/2017 | Coumou | |
| 10,049,857 | B2 | 8/2018 | Fisk, II | |
| 2014/0191808 | A1* | 7/2014 | Matsumoto | H03F 3/21 330/296 |
| 2014/0306742 | A1* | 10/2014 | Menzer | H03F 3/189 327/184 |
| 2016/0336150 | A1* | 11/2016 | Bhutta | H01J 37/32174 |
| 2019/0391547 | A1* | 12/2019 | Coumou | H01J 37/32174 |

* cited by examiner

*Primary Examiner* — Daniel C Puentes
(74) *Attorney, Agent, or Firm* — Neugeboren O'Dowd PC

(57) ABSTRACT

This disclosure describes systems, methods, and apparatus for generating a multi-level pulsed waveform using a DC section and a power amplifier. To improve DC section efficiency, a master state is used to determine when the rail voltage can be lowered, and to only allow a state assigned as the master state to lower the rail voltage. Selection of the master state is based on (1) any state having to raise the rail voltage to meet a power demand or (2) a state having the highest drive voltage as determined at the end of each pulse cycle. Further, to avoid challenges from integrator controller, drive voltage is carried over from a last state of one pulse cycle to a first state of a next pulse cycle and assignment of master state in the first state of each pulse cycle is not important and can be arbitrarily selected.

16 Claims, 17 Drawing Sheets

Time shown in Milliseconds

Time shown in Milliseconds

Time shown in Milliseconds

Time shown in Milliseconds

Time shown in Milliseconds

CONTROL OF RAIL VOLTAGE IN MULTI-LEVEL PULSING RF POWER AMPLIFIER

FIELD OF THE DISCLOSURE

The present disclosure relates generally to provision of pulsed waveforms to a plasma processing chamber. In particular, but not by way of limitation, the present disclosure relates to systems, methods and apparatuses for controlling a rail voltage of an RF power amplifier providing a pulsed output.

DESCRIPTION OF RELATED ART

In some plasma processing recipes, it is desirable to provide a pulsed waveform having multiple states (or power levels) as exemplified by the illustrative waveform in FIG. 2. Each recipe includes a number of pulse cycles (PC), number of pulses per pulse cycle, and a number of states per pulse. Each state has a different target power level. In this example, two pulse cycles are shown, the first pulse cycle having six pulses and each of those pulses having three states. The second pulse cycle has four pulses each having four states.

An RF generator for providing this pulsed waveform may include a DC section and a power amplifier, where the DC section provides a rail voltage to the power amplifier and the power amplifier provides the desired pulsed waveform (e.g., FIG. 2) using the rail voltage. The power amplifier is relatively fast (e.g., ~250 ns) compared to changes in the target voltage, but the DC section or the rail, is relatively slow (e.g., ~1 ms). As such, existing control systems tend to hold the rail at a high level for much of a pulse cycle (e.g., at a highest level needed for a given pulse cycle). However, this can lead to overheating of components and premature system failure and maintenance needs as well as inefficiency since the rail is often far above the level needed at any moment in time (i.e., for a given state within a pulse of a pulse cycle).

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

This disclosure provides a "master state" that is able to lower the rail voltage within a given pulse cycle, thereby avoiding much of the power losses and overheating experienced by prior control schemes. Further, this disclosure allows any state to raise the rail voltage, and any state raising the rail voltage (except a first state in a pulse cycle) becomes the master state and has sole authority to lower the rail voltage until an end of that pulse or until another state in the same pulse has to raise the rail voltage. At an end of each pulse within a pulse cycle, the master state switches to one of the states within all previous pulses in the pulse cycle— that state being the one with the highest phase/drive voltage. Thus, there are two mechanisms that dictate master state through a given pulse cycle: (1) one during each pulse; and (2) one at an end of each pulse. Further, challenges associated with the system's use of an integrator controller are mitigated by maintaining the phase/drive and rail voltage levels for a first state in a new pulse cycle at the same values seen during the last state of the previous pulse cycle (i.e., control of the phase/drive and rail voltage does not resort to memory at a start of each pulse cycle). In other words, phase/drive and rail voltage do not change for the very first state of a new pulse cycle. Finally, the rail voltage should not be reduced during a first pulse of a pulse cycle, unless a state raises the rail voltage and then pulls it back down "immediately" (i.e., within the first pulse of a pulse cycle).

Some embodiments of the disclosure may be characterized as a generator comprising a control section and a power generation section. The control section can include an RF driver, an RF controller, a DC driver, and a DC controller. The power generation section can be coupled to and configured to receive control signals from the control system. The power generation section can also include a DC section, an RF power amplifier, and an impedance matching network. The RF power amplifier can be coupled to and configured to receive a variable rail voltage from the DC section. The impedance matching network can be coupled between the RF power amplifier and an output of the generator. The match network can be arranged inside or outside the generator. The output can be configured for coupling to a plasma processing chamber and delivering RF power to a nonlinear plasma load. The RF controller and the DC controller can include one or more processing portions, one or more memories, and one or more modules stored on the one or more memories and executable on the one or more processing portions to: (1) for each state in an n-level waveform, raise the variable rail voltage if a target waveform requires a drive voltage of the RF power amplifier to equal or exceed a drive voltage threshold stored in the one or more memories, and make any state that causes the output of the DC section to rise, to become a master state; (2) at an end of each pulse, assign the master state to a previous state in a current pulse cycle of the target waveform having a greatest drive voltage of the RF power amplifier; and (3) for each state, check to see if a current state is the master state, and if so, instruct the DC section to lower its output if possible.

Other embodiments of the disclosure may also be characterized as a method comprising generating a multi-level power waveform based on a target waveform using an RF power amplifier with a variable output and deriving power from a DC section providing a variable rail voltage, the generated waveform having multiple pulse cycles, each pulse cycle having multiple repeating pulses, and each pulse having three or more states, each state having a different power level. The method can also include controlling the RF power amplifier with a drive voltage having a range of 0V to a drive voltage threshold. The method can also include, for each state, raising the variable rail voltage if the target waveform requires the drive voltage to equal or exceed the drive voltage threshold, and make any state that causes the variable rail voltage to rise to become a master state. The method can also include at an end of each pulse, assigning the master state to a previous state in a current one of the multiple pulse cycles having the greatest drive voltage. The method can also include for each state, checking to see if a current state is the master state, and if so, allow that state to lower the variable rail voltage if the variable rail voltage can be lowered.

Other embodiments of the disclosure can be characterized as non-transitory, tangible computer readable storage medium, encoded with processor readable instructions to perform a method for generating a multi-level pulsed waveform. The method includes receiving a multi-level target waveform having multiple pulse cycle each having multiple repeating pulses and each pulse having three or more states. The method also includes for each state, raising a rail voltage if the target waveform for that state calls for more power than can be achieved at a current value of the rail voltage, and assigning a master state to any state that causes the raising of the rail voltage. The method further includes at an end of each of the multiple repeating pulses, assigning the master state to a previous state in a current one of the multiple pulse cycles that used a greatest drive voltage. The method yet further includes generating a multi-level pulsed output waveform. The master state has sole authority to lower the rail voltage.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
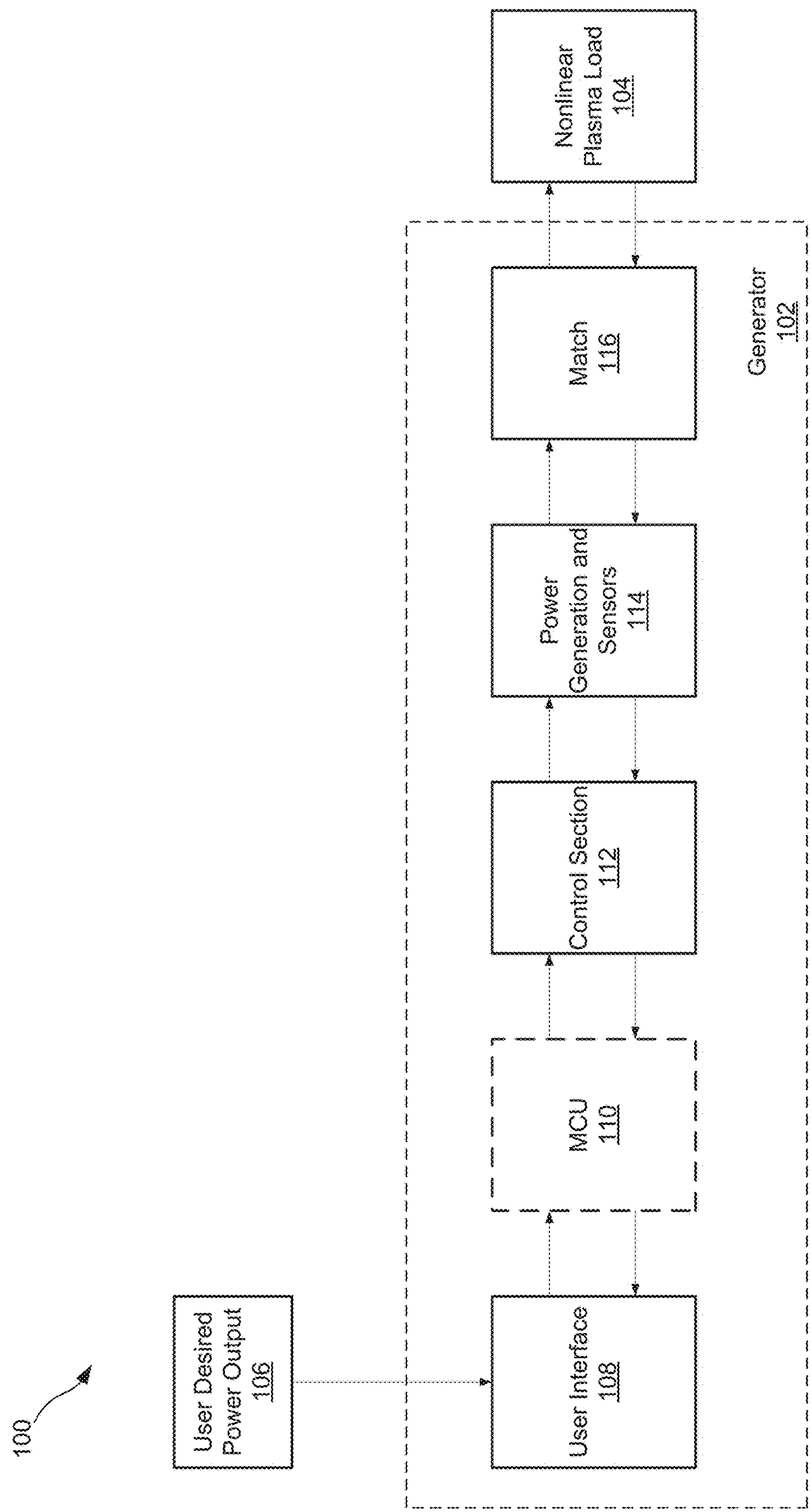
FIG. 1 illustrates a system-level view of an RF generator for providing a pulsed waveform to a nonlinear plasma load based on a user-defined power output.

The present disclosure relates generally to an RF generator for plasma processing, and more specifically to more efficient control of the rail voltage used to power an RF power amplifier producing a multi-level pulsed output.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a system-level view of an RF generator 102 for providing a pulsed waveform to a nonlinear plasma load 104 based on a user-defined power output 106. The RF generator (or "generator" for short) 102 can include a user interface 108, a master control unit (MCU) 110, a control section (e.g., an FPGA) 112, power generation and sensors 114, and a match network 116. This disclosure focuses on the control section 112 and the power generation and sensors 114, which are responsible for control and power delivery, respectively.

Figure 2:
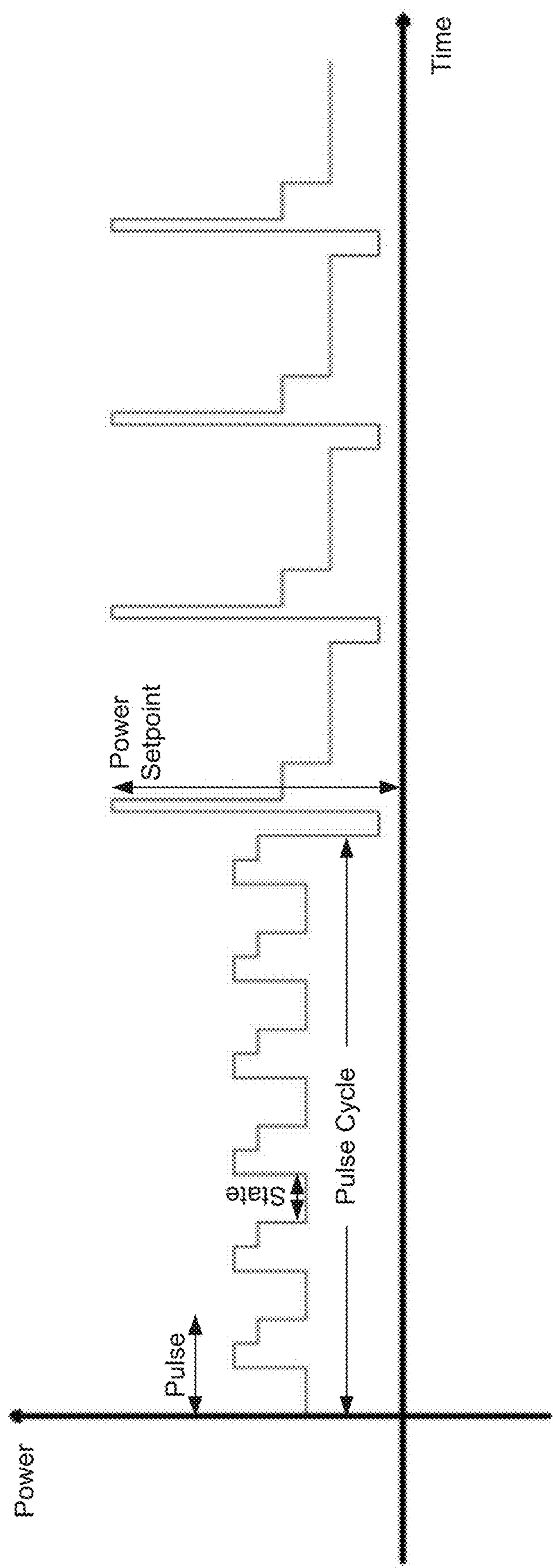
FIG. 2 illustrates a multi-level pulsed waveform that may be produced by the RF generators disclosed herein.
Figure 3:
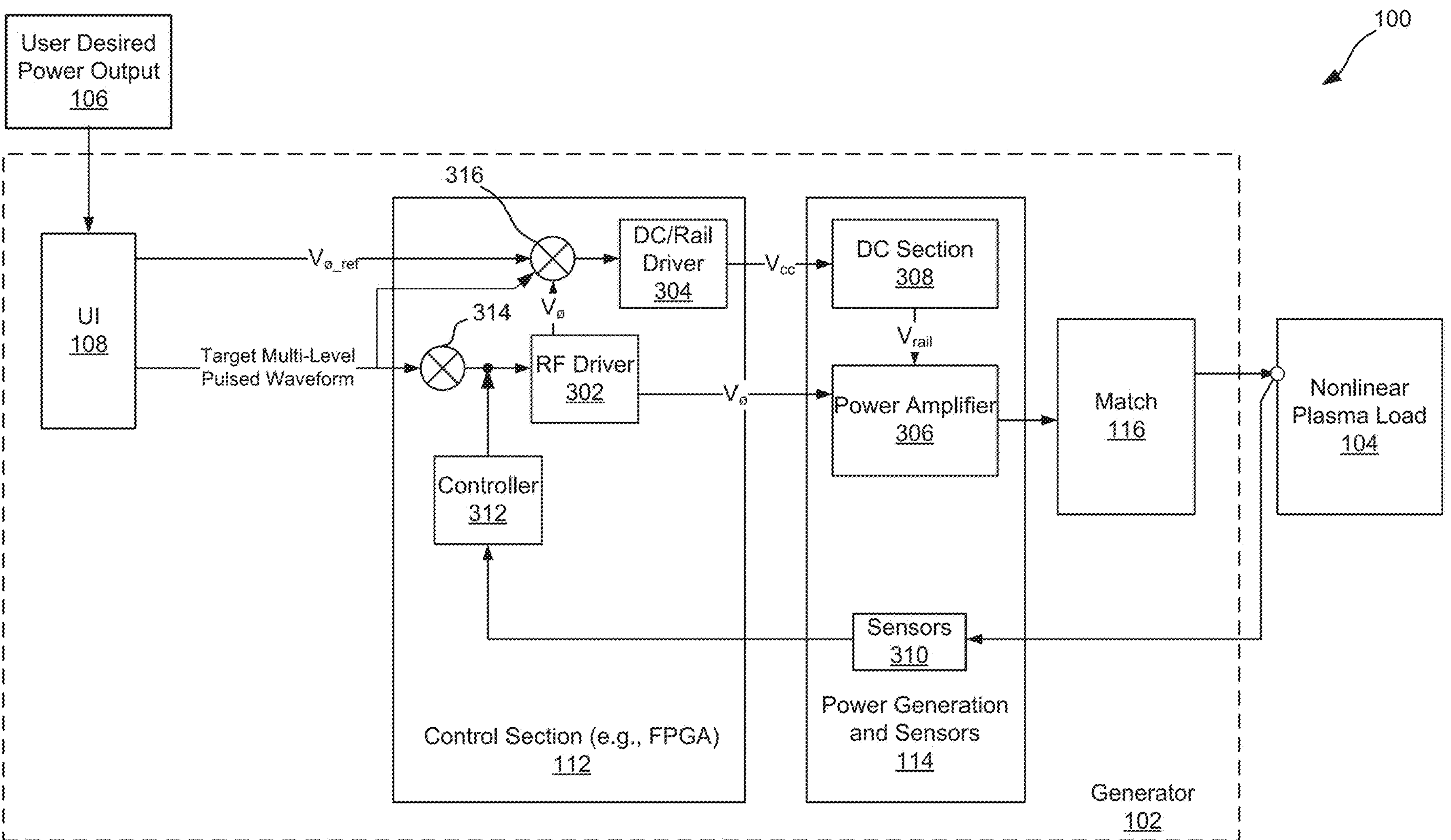
FIG. 3 provides additional details of the control section and the power generation and sensors in FIG. 1.

More specifically, FIG. 3 provides additional details of the control section 112 and the power generation and sensors 114. The UI 108 provides a phase/drive threshold or reference voltage, $V_{\varnothing\_ref}$, selected by the user as well as a target multi-level pulsed waveform (e.g., such as that seen in FIG. 2) to the control section 112. A "target waveform" will be used interchangeably with target multi-level pulsed waveform. The control section 112 includes controllers 316 and 314 as well as an RF driver 302 and a DC/rail driver 304. A controller 312 (e.g., an integrator-style controller) also provides feedback control from sensors 310 in the power generation and sensors 114 taking measurements from the match network output (or the chamber or nonlinear plasma load 116 or chamber input). The RF driver provides a phase/drive control signal, $V_{\varnothing}$, to a power amplifier 306 of the power generation and sensors 114, while the DC/rail driver 304 provides a rail voltage control signal, $V_{CC}$, to the DC section 308. The DC section 308 provides the rail voltage to the power amplifier 306 that then uses the rail voltage to generate the target waveform for provision to the match network 116. It will be appreciated that even though the match 116 is shown inside the generator 102, in other embodiments, the match 116 can be arranged outside the generator 102—between the generator 102 and the plasma load 104.

The functionality of this disclosure is distributed between the two controllers 302 and 304. In particular, the phase/drive controller 314 determines a phase/drive signal based on the target waveform and feedback from the integrator 312. Where the desired power output can be achieved via adjustment of the power amplifier 306 alone (i.e., at the current rail voltage), the phase/drive controller 314 merely instructs the RF driver 302 to provide a control signal to the power amplifier 306 corresponding to the desired power output for that state. However, where the desired power output is greater than what is possible at the current rail voltage, as determined by the phase/drive control signal reaching or exceeding the reference voltage, $V_{\varnothing\_ref}$, the rail controller 316 can instruct the DC/rail driver 304 to send a higher rail control signal, $V_{CC}$, to the DC section 308, which can then provide a higher rail voltage, $V_{rail}$, to the power amplifier 306. When this occurs, the state that called for the rail raising becomes the "master state," and is then solely able to lower the rail voltage for the remainder of the current pulse.

When the next pulse begins, the master state from the previous state can remain the master state unless there was a previous state in the pulse cycle that called for a higher drive/phase voltage. Whichever of these two situations occurs, whenever the master state comes around again in this next pulse, the controllers 314 and 316 will look at the power requirement from the target waveform, determine whether that requirement can be met without raising the rail and also determine whether the rail can be lowered while still achieving the target waveform. Where the power can be lowered for this state, the rail controller 316 instructs the DC/rail driver 304 to pass a rail control signal, $V_{CC}$ to the DC section 308 to lower the rail. At the same time, the RF controller 314 instructs the RF driver 302 to pass a phase/drive control signal, $V_{\varnothing}$, to the power amplifier 306 to adjust its output to meet the power requirement for the current state (a level that will be lower than the lowered rail). This cycle repeats with the controllers 314 and 316 in each pulse determining whether the master state can lower the rail voltage. This can continue within the current pulse cycle until the end of the pulse cycle or until another state needs to raise the rail voltage, at which point that state becomes the new master state or takes lone control of the ability to lower the rail voltage.

The RF power amplifier 306 is controlled by either a drive voltage or a phase signal, and thus we call the control signal a phase/drive control signal, $V_{\varnothing}$. In some embodiments, the drive signal can span a minimum to a maximum value and may be used as a bias signal for a single-ended amplifier such as a transistor. In some embodiments, the phase signal can span a minimum to a maximum value and may be used to control balanced amplifiers.

Figure 4:
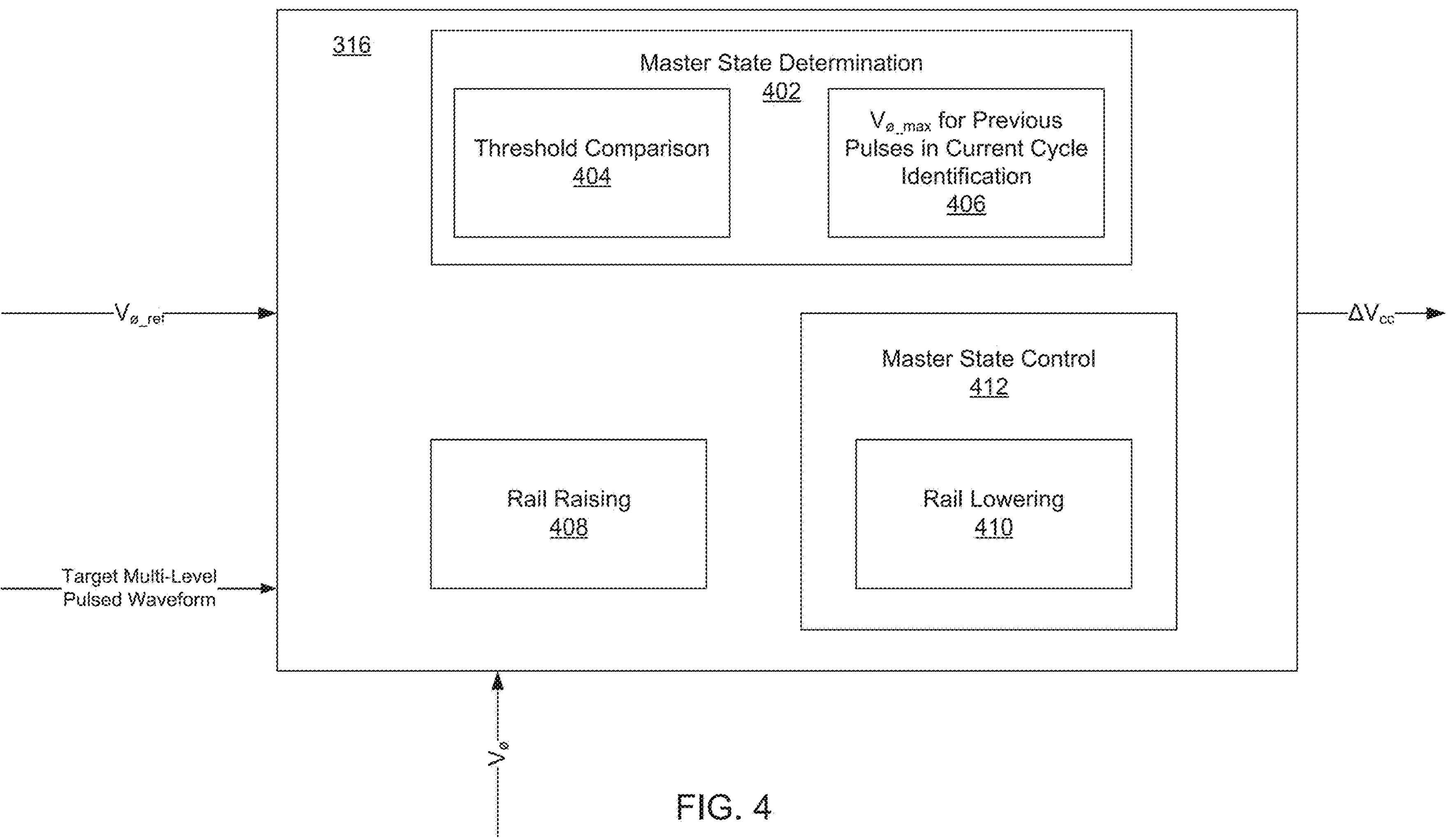
FIG. 4 illustrates details of an embodiment of a rail controller, such as the rail controller 316 in FIG. 3.
Figure 13A:
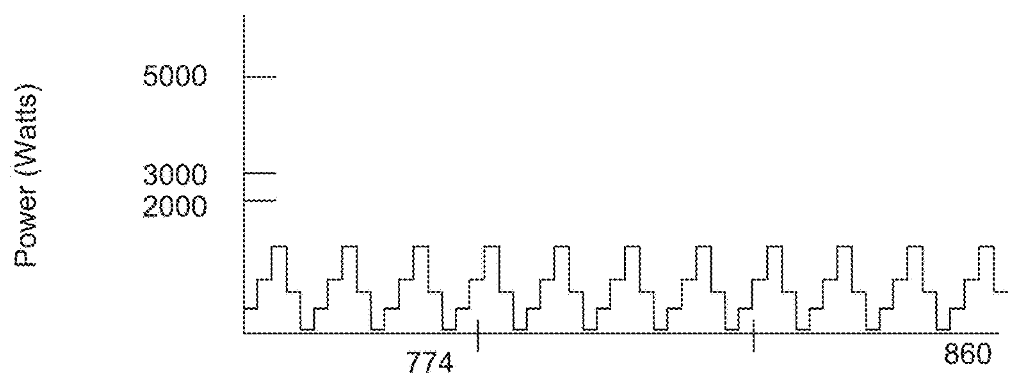
FIG. 13A illustrates details of the eighth cycle of the waveform shown in FIG. 7A.
Figure 13B:
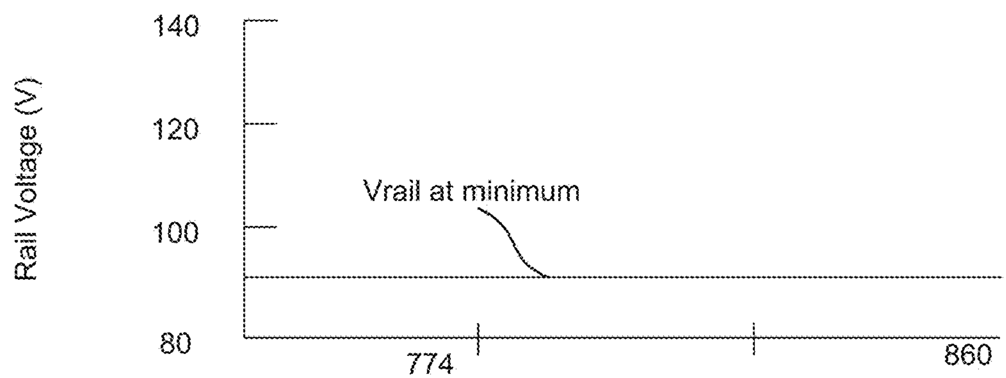
FIG. 13B illustrates details of the eighth cycle of the waveform shown in FIG. 7B.
Figure 13C:
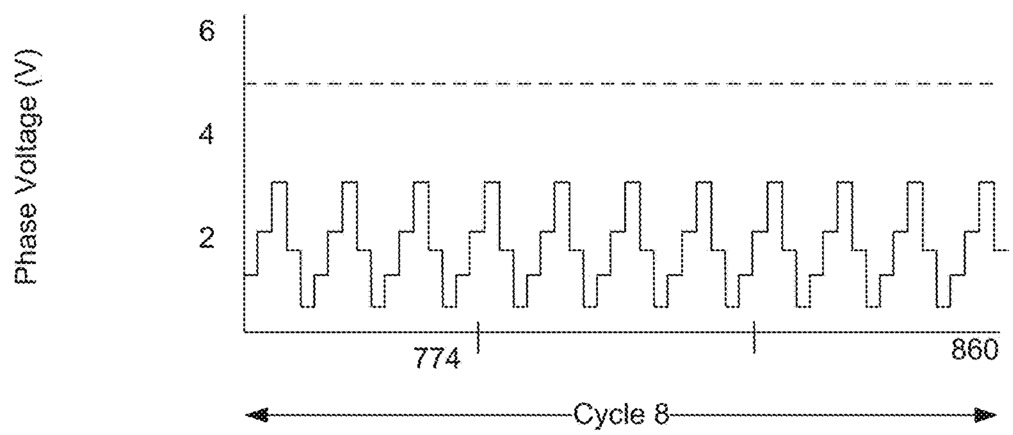
FIG. 13C illustrates details of the eighth cycle of the waveform shown in FIG. 7C.

A specific example of the rail controller 316 can be seen in FIG. 4. The rail controller 316 can include a master state determination 402 comprising a threshold comparison component 404 and a $V_{\varnothing\_max}$ for previous pulses in current cycle identification component 406. The rail controller 316 can also include a rail raising component 408 and a master state controller 412. The master state controller 412 can include a rail lowering component 410. Generally, the master state determination 402 can look at the target waveform, the drive/phase voltage threshold $V_{\varnothing\_ref}$, and a current drive/phase voltage $V_{\varnothing}$, and previous drive/phase voltages $V_{\varnothing}$ for the current pulse cycle to identify and assign the master state. This determination takes place for every state in a process, though the rules for determining the master state can depend on the state being investigated. For instance, each state has its drive/phase voltages $V_{\varnothing}$ compared to the drive/phase voltage threshold $V_{\varnothing\_ref}$ by the threshold comparison component 404, and if the drive/phase voltage $V_{\varnothing}$ is greater than the drive/phase voltage threshold $V_{\varnothing\_ref}$, and not in a first pulse of a new pulse cycle, then the rail raising component 408 raises the rail (increased $V_{CC}$) and the master state determination 402 identifies the current state as the master state. At the same time, at an end of each pulse, the $V_{\varnothing\_max}$ for previous pulses in current cycle identification component 406 looks back on all states in the current pulse cycle and identifies the state that had the highest drive/phase voltage $V_{\varnothing}$ and assigns the master state to the current state. Furthermore, the rail controller 316, through the master state control 412 and its rail lowering component 410, can check each state to see if the current state is the master state (from a previous assignment by the master state determination 402), and if so, and if the drive/phase voltages $V_{\varnothing}$ is less than the drive/phase voltage threshold $V_{\varnothing\_ref}$, then instruct the DC section to lower its output if possible (decreased $V_{CC}$). In some cases, the rail may be at a lowest value, and thus further lowering may not be possible (e.g., see Cycle 8 in FIG. 13 where rail lowering would occur based on the drive/phase voltage demanded, yet it does not because the rail is at a minimum value).

The rail lowering component 410 can determine whether to lower the DC section output based on whether the target waveform can be met with a lower DC section output and while keeping the drive/phase voltage of the RF amplifier below the drive/phase voltage threshold. In other words, typically when the rail is lowered, the drive/phase voltage is increased, such that the combined change still meets the target waveform setpoint. If the rail is lowered too far, then the drive/phase voltage must be raised above the drive/phase voltage threshold, and such a decision typically won't be allowed. Instead, the rail will only be lowered so far as possible while keeping the drive/phase voltage below the drive/phase voltage threshold. In some cases, the control algorithm attempts to push the drive/phase voltage to just under the threshold and thereby maximize the rail lowering for a given state. On the other hand, some control algorithms may prefer to keep the drive/phase voltage somewhat further below the threshold and not decrease the rail as much for a given state—a controller that could lead to greater stability, but slower responses. The design of this aspect of the controller does not change how the disclosure is implemented and should be left to the designer to select a preferred tradeoff.

Figure 5:
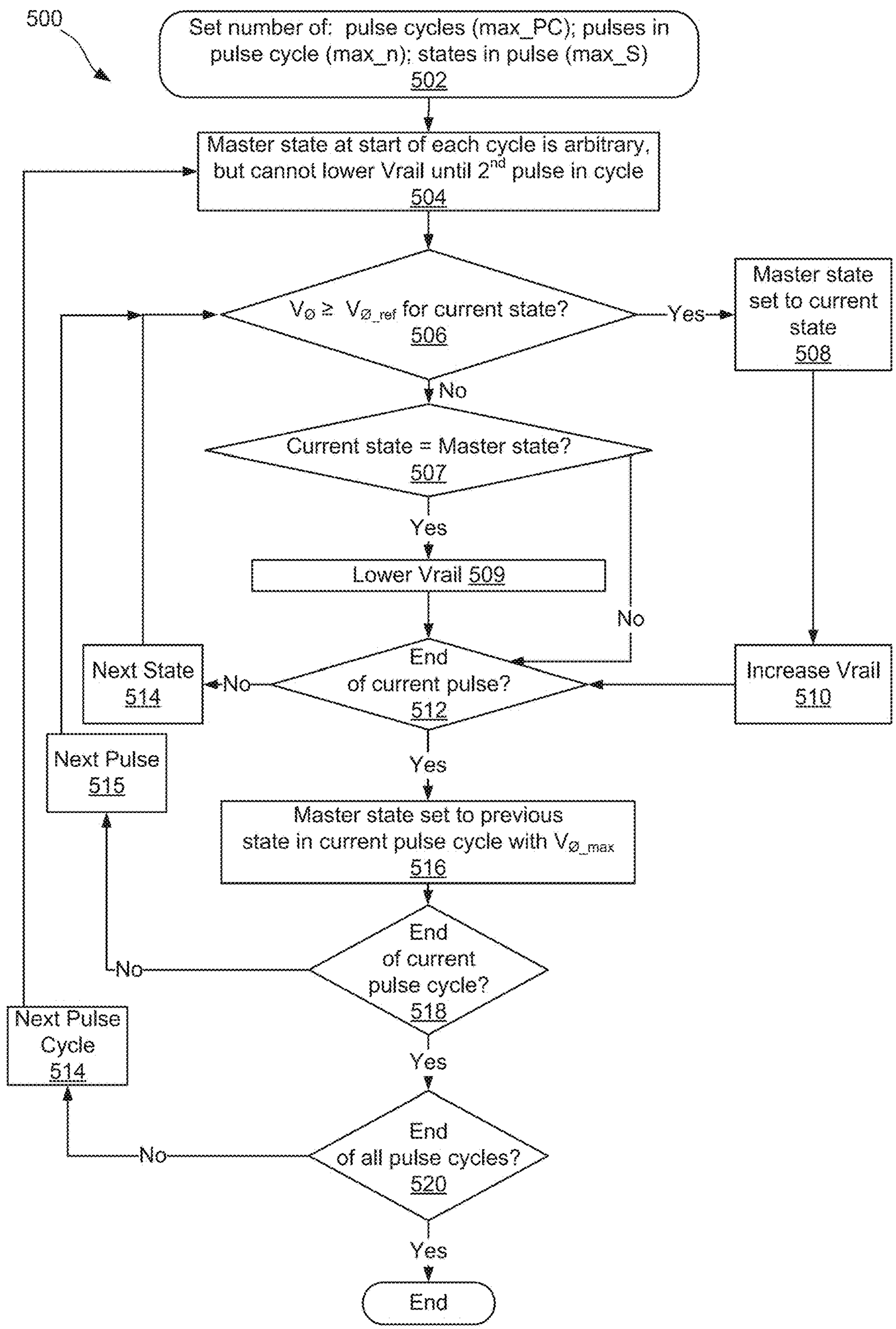
FIG. 5 illustrates a n-level control algorithm for an RF generator having a DC section providing a rail voltage to an RF amplifier for providing a pulsed-waveform to a plasma load or other nonlinear load.
Figure 7A:
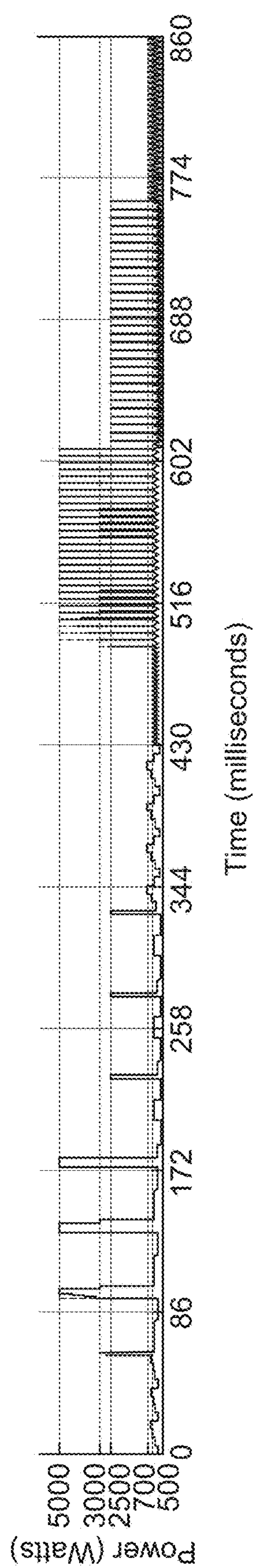
FIG. 7A illustrates a simulated waveform for target and output power corresponding to the systems shown in FIGS. 1, 3 and 4.
Figure 7B:
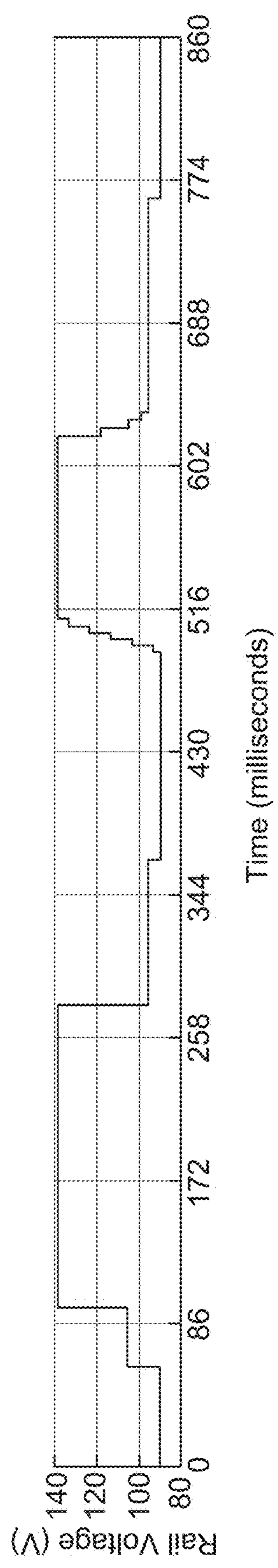
FIG. 7B illustrates a simulated waveform for rail voltage corresponding to the systems shown in FIGS. 1, 3, and 4.
Figure 7C:
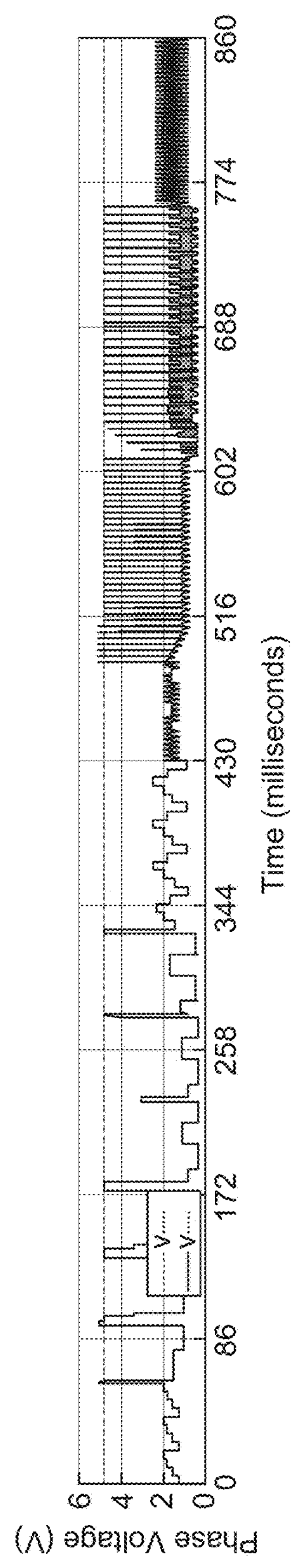
FIG. 7C illustrates a simulated waveform for phase/drive voltage and the drive voltage threshold corresponding to the systems shown in FIGS. 1, 3, and 4.
Figure 8A:
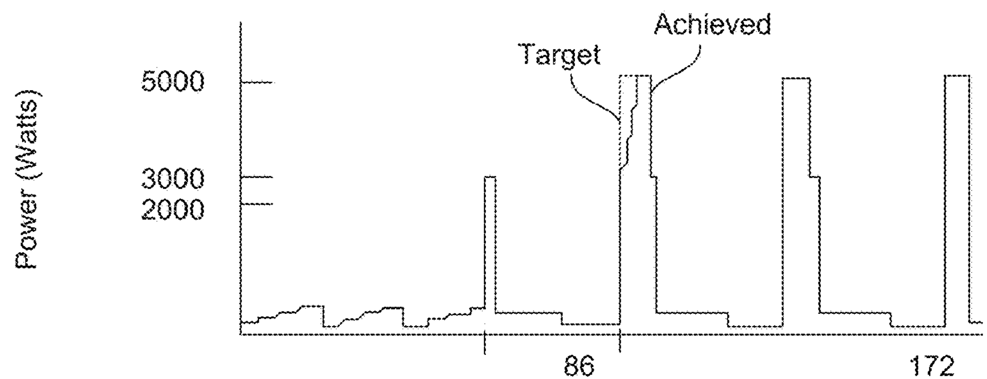
FIG. 8A illustrates details of the first and second cycles of the waveform shown in FIG. 7A.
Figure 8B:
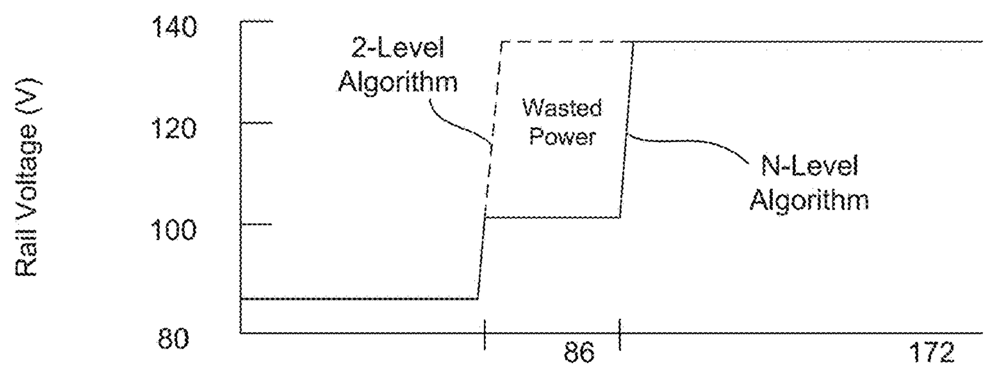
FIG. 8B illustrates details of the first and second cycles of the waveform shown in FIG. 7B.
Figure 8C:
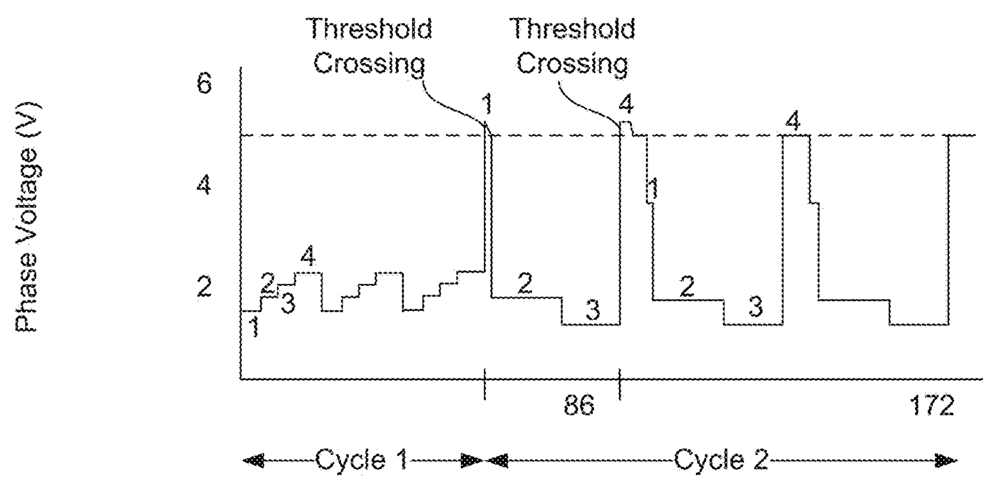
FIG. 8C illustrates details of the first and second cycles of the waveform shown in FIG. 7C.
Figure 9A:
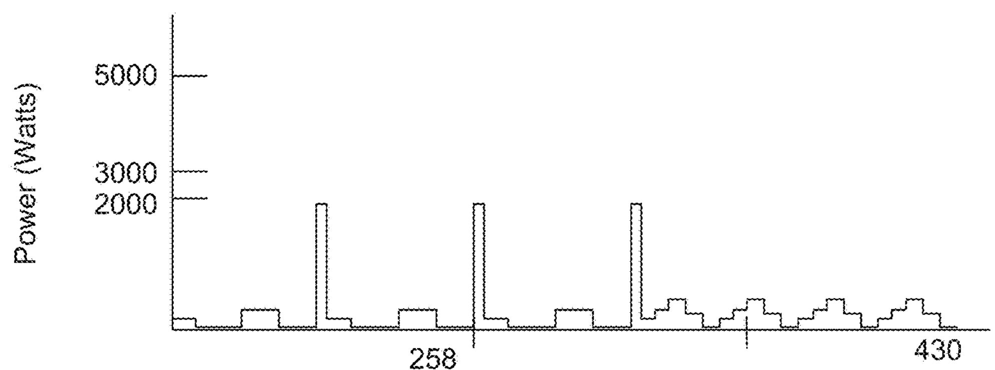
FIG. 9A illustrates details of the third and fourth cycles of the waveform shown in FIG. 7A.
Figure 9B:
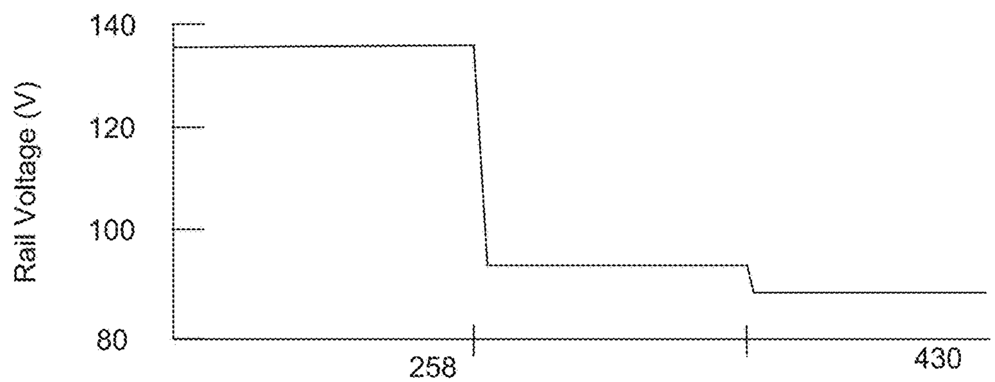
FIG. 9B illustrates details of the third and fourth cycles of the waveform shown in FIG. 7B.
Figure 9C:
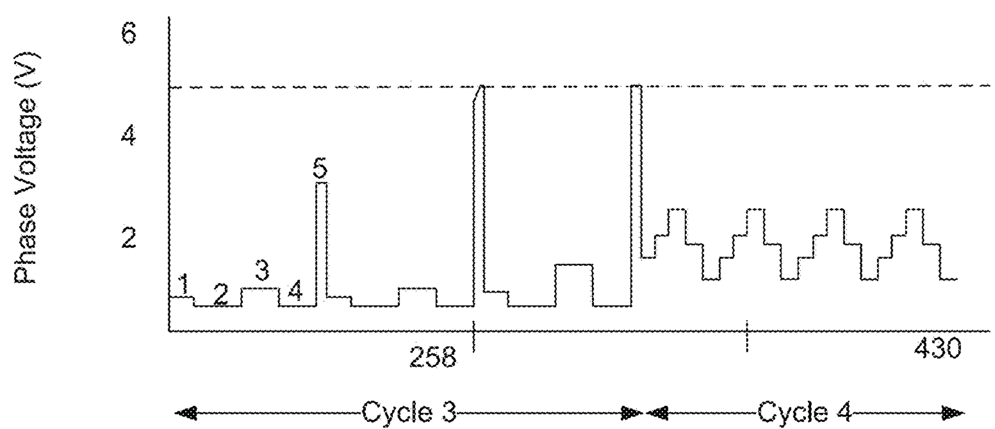
FIG. 9C illustrates details of the third and fourth cycles of the waveform shown in FIG. 7C.
Figure 10A:
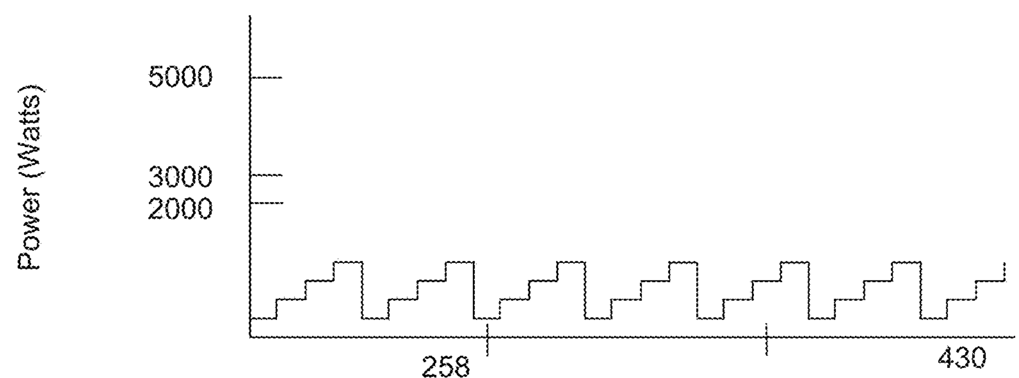
FIG. 10A illustrates details of the fifth cycle of the waveform shown in FIG. 7A.
Figure 10B:
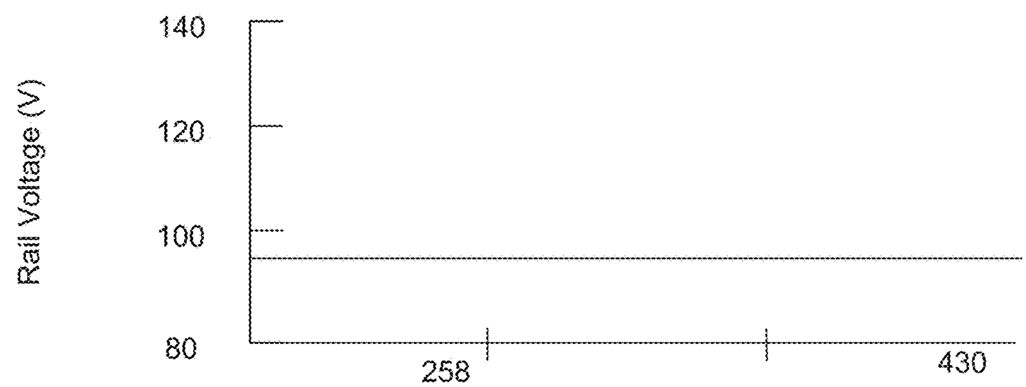
FIG. 10B illustrates details of the fifth cycle of the waveform shown in FIG. 7B.
Figure 10C:
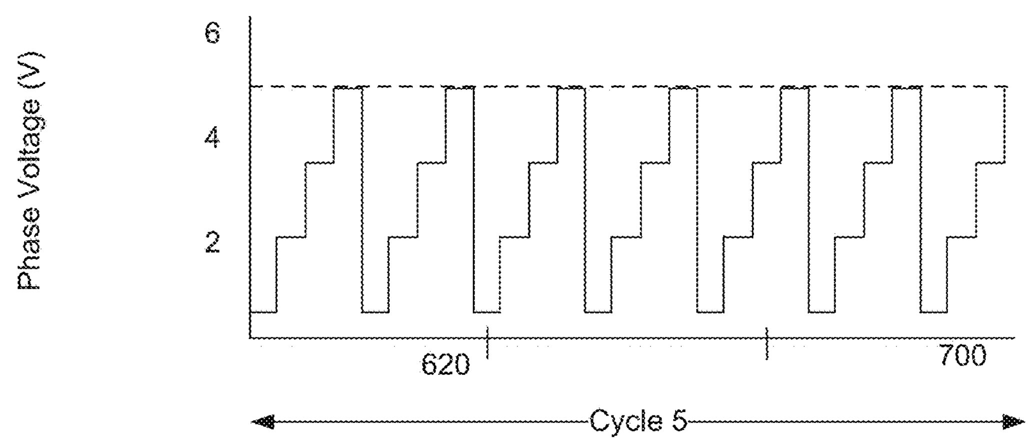
FIG. 10C illustrates details of the fifth cycle of the waveform shown in FIG. 7C.
Figure 11A:
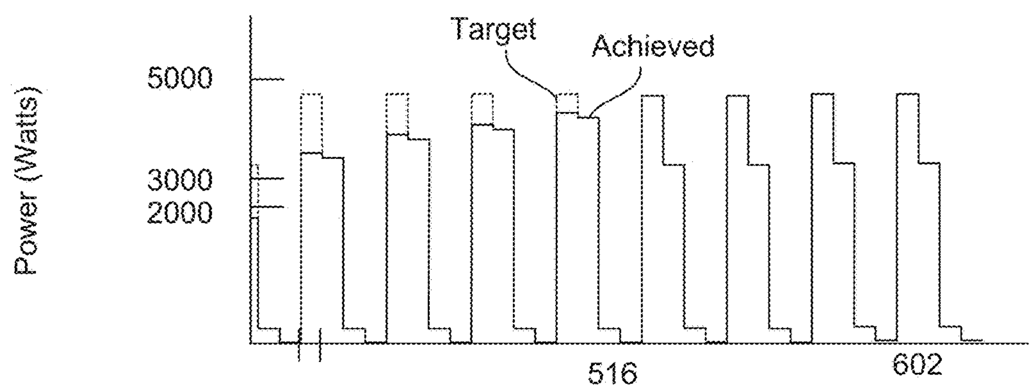
FIG. 11A illustrates details of the sixth cycle of the waveform shown in FIG. 7A.
Figure 11B:
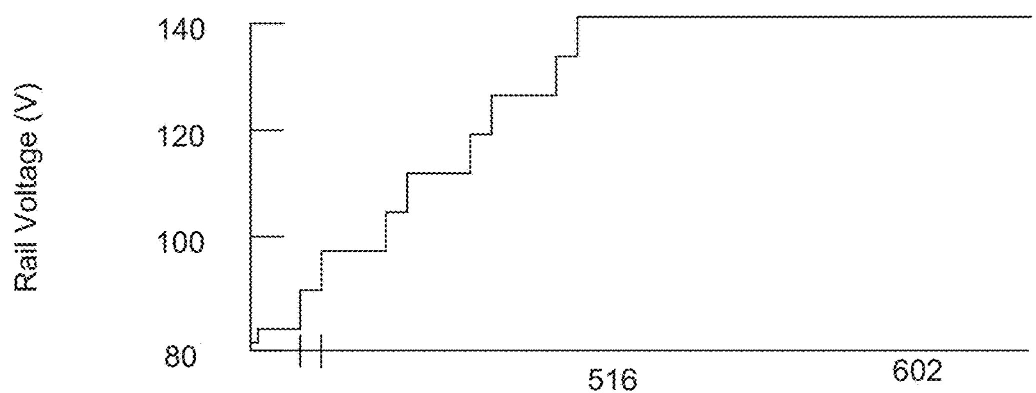
FIG. 11B illustrates details of the sixth cycle of the waveform shown in FIG. 7B.
Figure 11C:
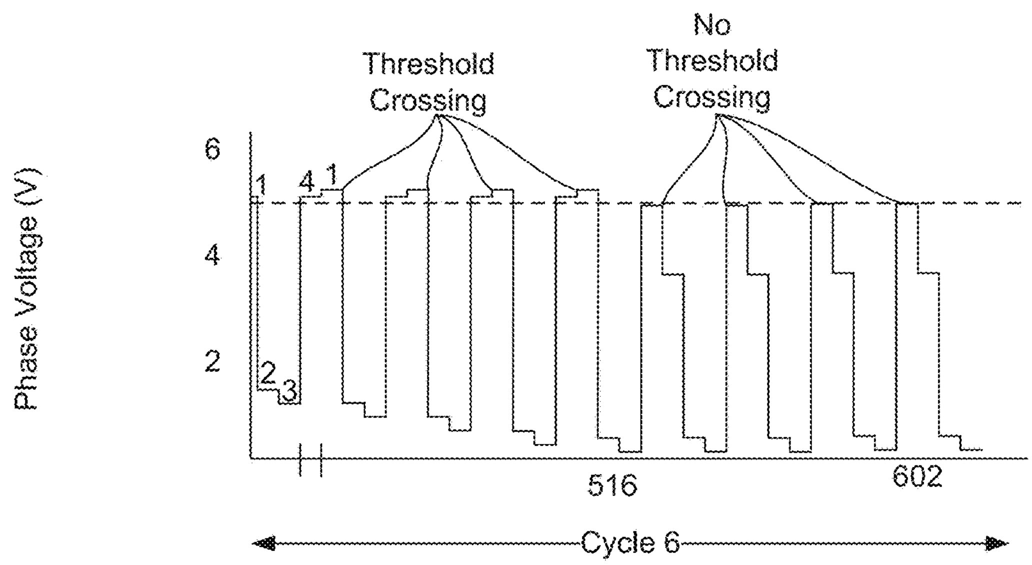
FIG. 11C illustrates details of the sixth cycle of the waveform shown in FIG. 7C.
Figure 12A:
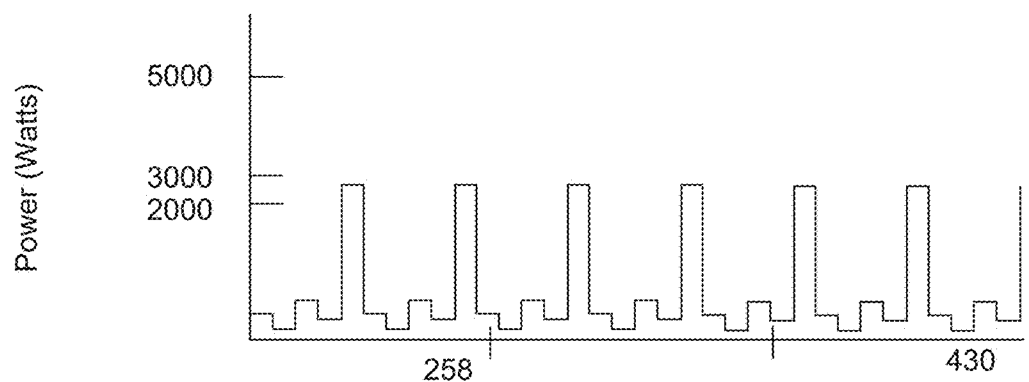
FIG. 12A illustrates details of the seventh cycle of the waveform shown in FIG. 7A.
Figure 12B:
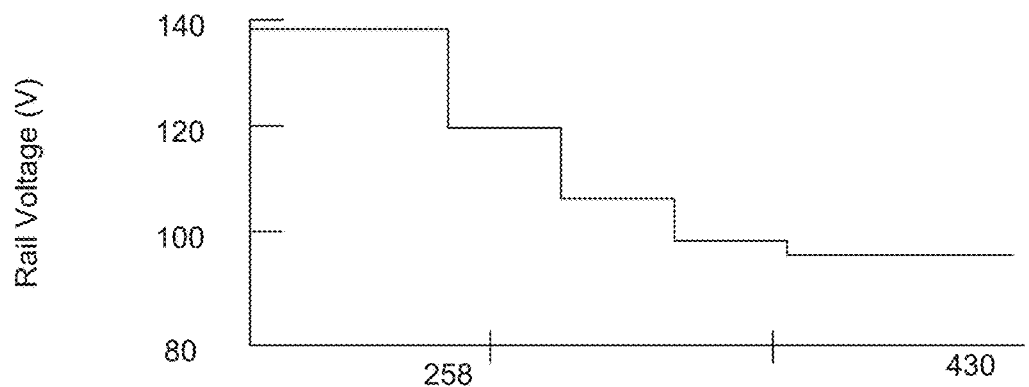
FIG. 12B illustrates details of the seventh cycle of the waveform shown in FIG. 7B.
Figure 12C:
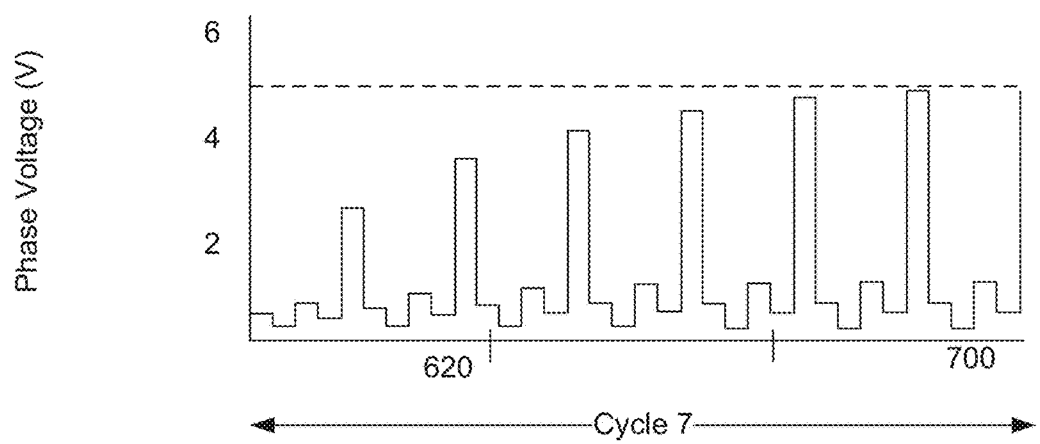
FIG. 12C illustrates details of the seventh cycle of the waveform shown in FIG. 7C.

The operation of the controllers 314 and 316 can be further illustrated via reference to the method 500 shown in FIG. 5 and the plots in FIGS. 7-13. FIG. 7 shows an exemplary timing chart for a target waveform of the generator (top chart) (e.g., output of power amplifier 306 or generator 102), rail voltage (middle chart), and drive/phase voltage (bottom chart) over eight different pulse cycles. The output power is equal to the target waveform (i.e., effective power tracking is achieved in most instances of this simulation), though FIGS. 8 and 10 show some instances where the target waveform is not reached immediately upon a change in the target waveform. The rail voltage (e.g., as provided by DC section 308) is slow to control and is the variable that this disclosure seeks to control with greater efficiency than was possible in the prior art (e.g., lowering the rail voltage more often than was possible in the art). The drive or phase voltage is the controllable aspect of the RF power amplifier (e.g., 306). The eight illustrated pulses cycles in FIGS. 7-13 are derived from a simulation, and walk through waveforms that show various features of the method 500 not known in the art. FIGS. 8-13 provide more detailed views of certain pulse cycles from FIG. 7. Each pulse cycle has a different number of pulses, and each pulse has a different number of states. For instance, in FIG. 8 one can see the first and second pulse cycles, each with three pulses and each pulse having four states. In FIG. 9 one can see third and fourth pulse cycles, the third pulse cycle having three pulses and five states for each pulse, and the fourth pulse cycle having four pulses and five states per pulse cycle. In these simulated pulse cycles, the RF power amplifier is seen to take rail voltage from the DC section and then uses the drive or phase voltage to determine an ultimate output power based on the available rail voltage. A threshold can be seen as a dotted line around 5 V in the bottom plots, and whenever the drive/phase voltage reaches or exceeds this threshold, the rail voltage is raised to provide more power to the RF power amplifier. In some cases, the rail will not rise fast enough to meet an increased power requirement of the target waveform, and multiple threshold crossings in a short time may occur as the rail is raised in a stepwise fashion, such as illustrated in FIG. 11 (where the target waveform is not achieved until the fifth pulse in the pulse cycle). The third and fourth cycles in FIG. 9 show instances where the power requirement of the target waveform is low enough that the rail voltage can be lowered, reducing power consumption and heating as compared to prior art methods. FIG. 8 also shows a comparison between traditional methods for raising the rail voltage and that of the current disclosure. One can see that the first threshold crossing leads to a rail voltage increase, which would have pulled to the rail's max in traditional methods, but in this disclosure, the rail is only pulled to around 100V, and then raised again at the next threshold crossing to the rail max near 140V. As a result, this more granular tracking of target waveform leads to a large decrease in wasted power as seen in the area between the dashed line (resulting from a traditional "2-Level Algorithm") and the solid line (resulting from the herein-disclosed N-Level Algorithm).

The user can initiate the process by setting a number of pulse cycles (max_PC), setting a number of pulses in each pulse cycle (max_n), and setting a number of states in each pulse (max_S) (Block 502). As power delivery begins (i.e., the first pulse cycle), and at the start of each subsequent pulse cycle, the master state initiation can be arbitrary (i.e., any of the states in the first pulse of a pulse cycle can be the master state (or none)) since the method 500 avoids relying on memory of state or drive/phase voltage between cycles (Block 504). In other words, each pulse cycle selects a first master state afresh, without knowledge of or reliance on any master state from the previous pulse cycle, and thus the initial master state can be arbitrarily selected by the designer. Along these same lines, when a first master state is determined in a pulse cycle, that master state cannot lower the rail until at least the second pulse in the current pulse cycle. In other words, even if a state raises the rail and becomes the master state in the first pulse of a new pulse cycle, it will be unable to lower the rail voltage until the second pulse in the pulse cycle. This feature is illustrated in FIG. 3. An exception to this rule is when a state raises the rail voltage and then seeks to lower the voltage rail, both within the same state. In this case of a rapid rise and fall of the rail voltage, the first state will be able to perform this rail lowering. This is an exception to Block 504, but the exception is not explicitly illustrated.

Then, for the current state, the rail controller 316 determines whether the voltage rail needs to be raised, for instance by determining if the drive/phase voltage, $V_{Ø}$, requested is equal to or greater than the threshold phase voltage, $V_{Ø\_ref}$, (Decision 506). This effectively determines whether the rail needs to be raised. If the required drive/phase voltage, $V_{Ø}$, is greater than the threshold phase voltage, $V_{Ø\_ref}$, (Decision 506=Yes), then the master state is set to the current state (Block 508) and the rail controller increases the rail voltage (Block 510).

For example, in FIG. 8, for the first state of the first pulse of the first pulse cycle, the power requirement of the target waveform is fairly low, around 85V, and thus a relatively low drive/phase voltage is able to achieve this target waveform even with the rail voltage starting fairly low (~85V). So, decision 506 for the first state of the process would=No. Where decision 506=No, the rail controller can then determine if the current state became the master state via a previous decision. For instance, a previous threshold crossing (Decision 506) or a previous end-of-pulse identification (Block 516) could set the master state for the current pulse even if the current pulse doesn't see a threshold crossing. More specifically, state 5 in the first pulse of pulse cycle 3 becomes the master state by virtue of having the largest drive/phase voltage, $V_{ø}$, in pulse cycle 3, and is thus the master state when state 5 in the second pulse comes around (despite no threshold crossing). In other words, state 5 in the second pulse became the master state due to a previous decision. When this type of master state selection occurs, Decision 507=yes, and the rail controller can lower the voltage rail to conserve power (Block 509). For instance, and again looking at the second pulse of the third pulse cycle in FIG. 9, there is a rail reduction controlled by state 5 as the master state. More specifically, and as will be understood via later steps in the method 500, state 5 becomes the master state in the first pulse of the third pulse cycle. When state 5 comes around again in the second pulse, the power requirement is low enough that even at a maximum value of the drive/phase voltage, $V_{ø}$, that power requirement can be met with a lower rail voltage, so the rail controller is able to lower the rail voltage at state 5. This same rail voltage is sufficient for the next instance of state 5 in the third pulse of the third cycle, so the rail controller (or state 5 as the master state), does not lower the rail, so the rail voltage stays flat through to the fourth cycle. As another example of rail voltage lowering, pulse cycle 7 sees the fifth state become the master state at the end of the first pulse by virtue of having, $V_{Ø\_max}$, to that point in pulse cycle 7. However, becoming the master state via block 516 means that lowering the rail voltage is not possible until that state returns in the next pulse, and hence the rail voltage around time 200 remains constant despite state 5 becoming the master state. It is not until state 5 returns in the second pulse that the rail controller determines that the current state is the master state (Decision 507=Yes) and lowers the rail voltage (Block 509) to around 120V. At the same time, since the rail voltage is being reduced, the drive/phase controller also determines via feedback from the generator 102 output through the integrator (e.g., 312), that greater drive/phase voltage is needed to achieve the target waveform and therefore raises the phase/drive voltage as seen in the second pulse. This cycle of lowering the rail voltage and increasing the phase/drive voltage continues until the drive/phase controller determines that the rail voltage cannot be lowered further. In the simulation this occurs at the sixth pulse and where state 5 is just below the threshold. Although a particular combination of rail lowering and phase/drive voltage raising is shown, various control algorithms can be used to achieve the rail lowering without affecting the method 500, and those of skill in the art can select from these various options without departing from the spirit of this disclosure. For instance, other control algorithms might lead to faster or slower reductions in the rail voltage than seen in FIG. 12.

Returning to Decision 507, if the current state is not the master state, then the method 500 determines if the current pulse has ended (Decision 512). Similarly, after the rail has been lowered (Block 509), the method 500 determines if the current pulse has ended (Decision 512). If not, then the method 500 moves to the next state and decisions 506, and possibly 507, repeat. For instance, for the first three states of each pulse in the first pulse cycle, Decision 512=No, and the method 500 loops back to Decision 506 for a next state (Block 514).

If the end of the current pulse has been reached (Decision 512=Yes), then the phase/drive controller looks to set to the master state based on previous drive/phase voltages in the current pulse cycle (Block 516). More specifically, the phase/drive controller looks back at the phase/drive voltages for each state in the current pulse cycle and identifies a largest value therein. For instance, at the end of the first pulse of the first pulse cycle in FIG. 8, the phase/drive controller would determine that state 4 had the highest drive/phase voltage level for the pulse cycle to that point and therefore set the master state to state 4 (if it was not already the master state) (Block 516). This same analysis at the end of the second pulse would again determine that state 4 had the highest drive/phase voltage level and thus leave state 4 as the master state. In the second cycle the first state would become the master state by virtue of crossing the threshold (Decision 506=Yes), and then state 4 would become the master when it crosses the threshold (Decision 506=Yes), and at the end of the second pulse the phase/drive controller would look back at all states in the second pulse cycle and determine that state 4 had called for the highest drive/phase voltage level and thus leave state 4 as the master state (Block 516). As another example, the phase/drive controller assigns the master state to state 5 in the third cycle, and the phase/drive controller assigns the master state to state 3 in the fourth cycle via this look-back analysis. On the other hand, if state 1 had called for a higher drive/phase voltage level than state 4 during the first two pulses of the second pulse cycle, then the phase/drive controller would make state 1 the master state. As another example, in the third pulse cycle no state reaches the threshold (Decision 506≠Yes for any state), but at the end of the first pulse, phase/drive controller would determine that state 5 had the highest drive/phase voltage level in the third pulse cycle and make state 5 the master state. From these examples it should be apparent that the phase/drive controller, via Block 516, at the end of each pulse can select a new master state.

Either way, at the end of each pulse, the method 500 determines if the current pulse cycle has ended (Decision 518). If not, the method 500 moves to the next pulse 515, and if the pulse cycle has ended, then the method 500 assesses whether the process has ended (i.e., have all pulse cycles ended) (Decision 520). If not, then then the method 500 proceeds to a next pulse cycle (Block 514) and returns to Block 504, where the phase/drive voltage and rail voltage are held the same through to the first state of the new pulse cycle, and the master state is arbitrarily selected by the designer.

Pulse cycle 8 shows an additional feature of the method 500 that is not explicitly shown, namely, that the rail voltage has a minimum. One can see that state 3 in pulse cycle 8 becomes the master state via Block 516 at the end of the first pulse and remains the master state in subsequent pulses since no other state needs to raise the rail (Decision 506) or has a higher phase/drive voltage (Block 516). However, unlike previous examples, even though state 3 is the master state and the phase/drive voltage needed to achieve the target waveform is lower than the threshold (Decision 506=No), the rail controller does not lower the rail voltage as should be required by Block 509. This is because the rail voltage is at a minimum and thus can't be lowered further. In other words, Block 509 will be skipped or not apply if the rail voltage is already at its minimum.

Figure 6:
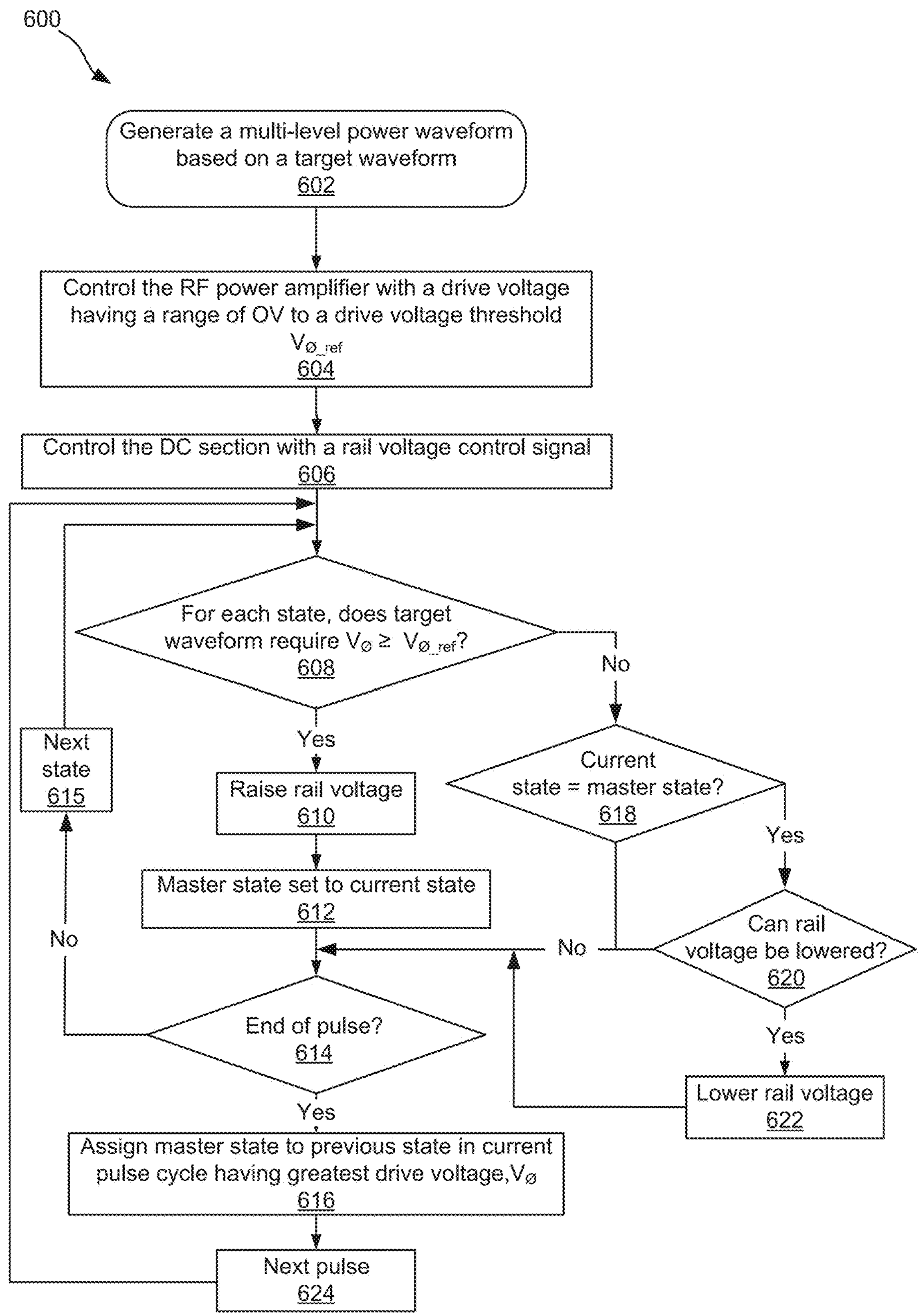
FIG. 6 illustrates another n-level control algorithm for an RF generator having a DC section providing a rail voltage to an RF amplifier for providing a pulse-waveform to a plasma load or other nonlinear load.

FIG. 6 illustrates another n-level control algorithm for an RF generator having a DC section providing a rail voltage to an RF amplifier for providing a pulse-waveform to a plasma load or other nonlinear load. The method 600 focuses on decisions within a single pulse, but one of skill in the art can, without undue experimentation, extend this method 600 to multiple pulse cycles. The method 600 starts by generating a multi-level power waveform based on a target waveform using an RF power amplifier with a variable output and deriving power from a DC section providing a variable rail voltage (Block 602). A multi-level (or n-level) power waveform can be seen, for instance, in FIG. 7A. The multi-level power waveform (output or generated waveform) and the target waveform (input) typically are close in shape since the method is effective at tracking the target waveform, and therefore, for purposes of this disclosure, FIG. 7A will be used to discuss both the input and output waveforms. RF power amplifier 306, and DC section 308, are non-limiting examples of the RF power amplifier and DC section discussed in the method 600. The generated waveform has multiple pulse cycles, each pulse cycle having multiple repeating pulses, and each pulse having three or more states, each state having a different power level. The method 600 further includes controlling the RF power amplifier (e.g., 306) with a drive voltage having a range of 0V to a drive voltage threshold, $V_{\varnothing\_ref}$ (Block 604). This threshold is illustrated for instance, as the dashed horizontal line in FIGS. 7C, 8C, 9C, 10C, 11C, 12C, and 13C, all around 5V. For instance, the controlling 604 can be performed by controller 314 and driver 302. In addition to controlling the RF power amplifier, the method 600 also controls the DC section (e.g., 308) with a rail voltage control (e.g., $V_{CC}$). For instance, the controlling 606 can be performed by controller 316 and driver 304. Thus, the method 600 can be distributed between the controllers 314 and 316, or between controllers and drivers 314, 316, 302, and 304, or between controllers, drivers, and amplifier/drive sections 314, 316, 302, 304, 306, and 308. Given these control parameters and the target waveform, the method 600 raises the rail voltage (Block 610) if the target waveform requires the drive voltage to equal or exceed the drive voltage threshold, $V_{\varnothing\_ref}$ (Decision 608=Yes). If such a condition exists (i.e., a state raises the rail voltage), then the method 600 makes that state that caused the rail voltage to rise, the master state (Block 612). The method 600 then determines whether the current pulse is at an end (Decision 614). If the target waveform could be met with the drive voltage staying below the drive voltage threshold, $V_{\varnothing\_ref}$ (Decision 608=No), then no changes to the rail voltage or master state occur. However, for each state, the method checks to see if a current state is the master state (Decision 618), and if so, allows the current state to lower the rail voltage if possible (Decision 620). In particular, lowering the rail voltage is possible if the target waveform can be achieved with the lower rail voltage and via a drive voltage below the drive voltage threshold, $V_{\varnothing\_ref}$. If both conditions are not met (Decision 620=No), then the method determines if the current pulse has ended (Decision 614). If both conditions are met (Decision 620=Yes), then the method 600 lowers the rail voltage (Block 622) and then determines if the current pulse has ended (Decision 614).

Whichever path brings the method 600 to the determination of pulse ending (Decision 614), if the pulse has not ended, then the method 600 moves to a next state (Block 615). If the pulse has ended, then the method 600 assigns the master state to a previous state in a current one of the multiple pulse cycles having the greatest drive voltage, $V_{\varnothing}$, (Block 616) and proceeds to the next pulse (Decision 624).

Figure 15:
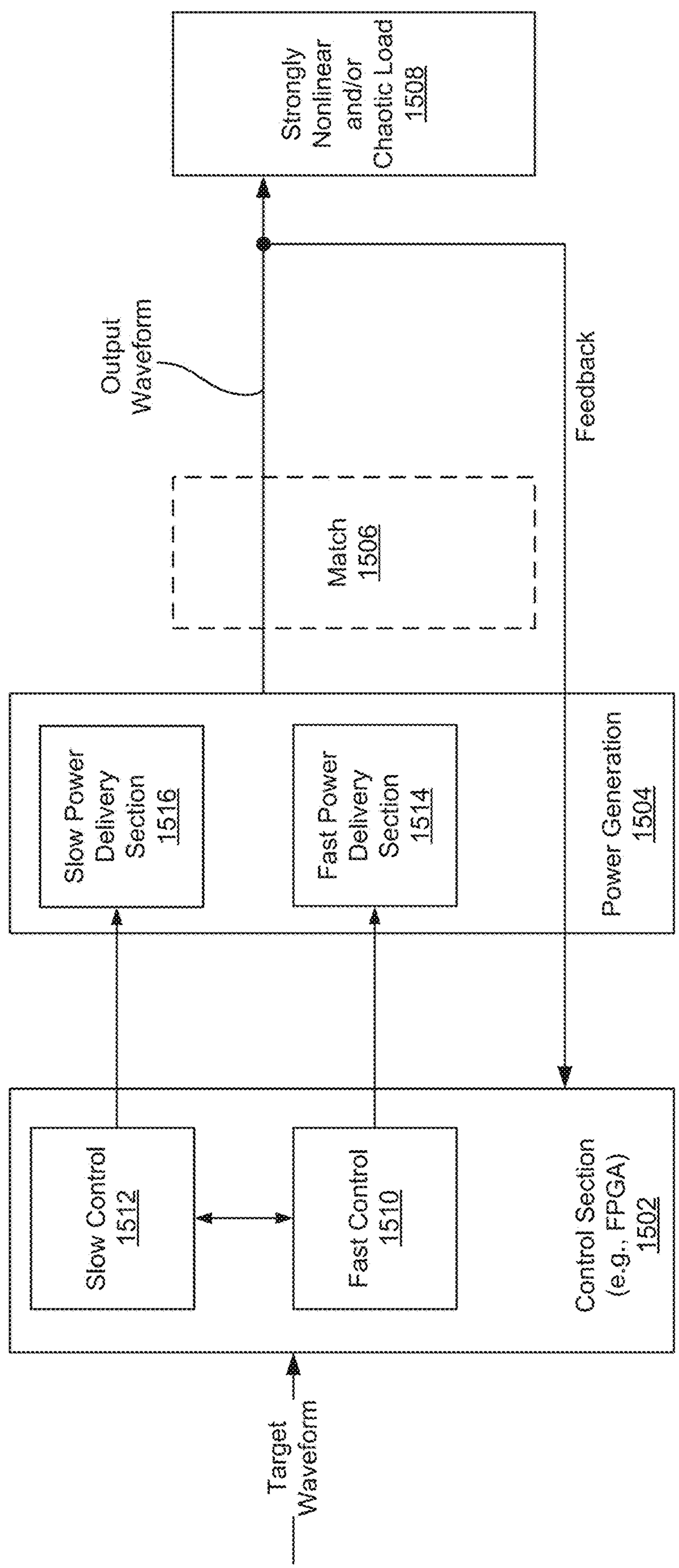
FIG. 15 illustrates a power generation system having a fast control and a slow control.
Figure 16:
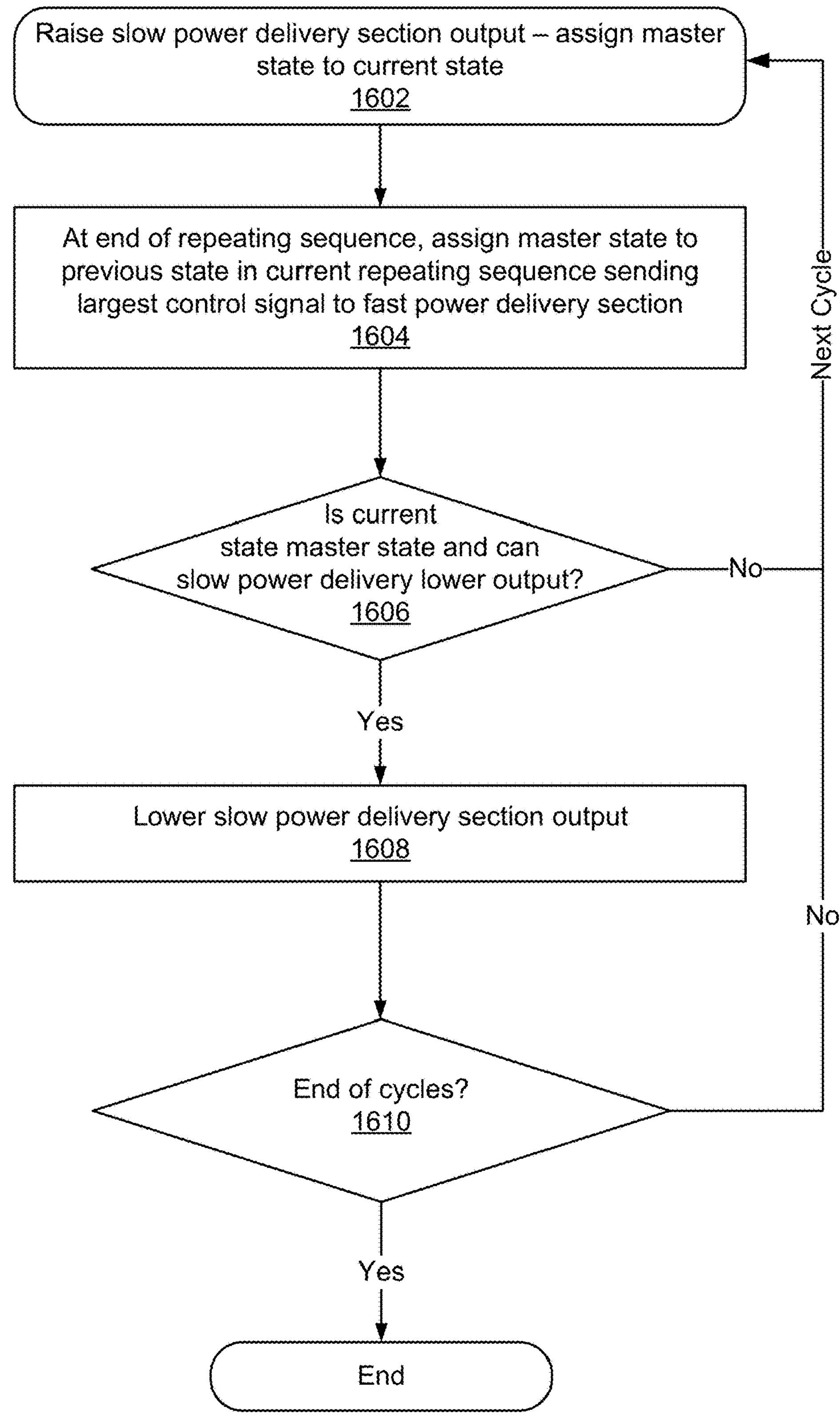
FIG. 16 illustrates a method of selecting a master state capable of lowering the slow control in the power generation system of FIG. 15.
Figure 17:
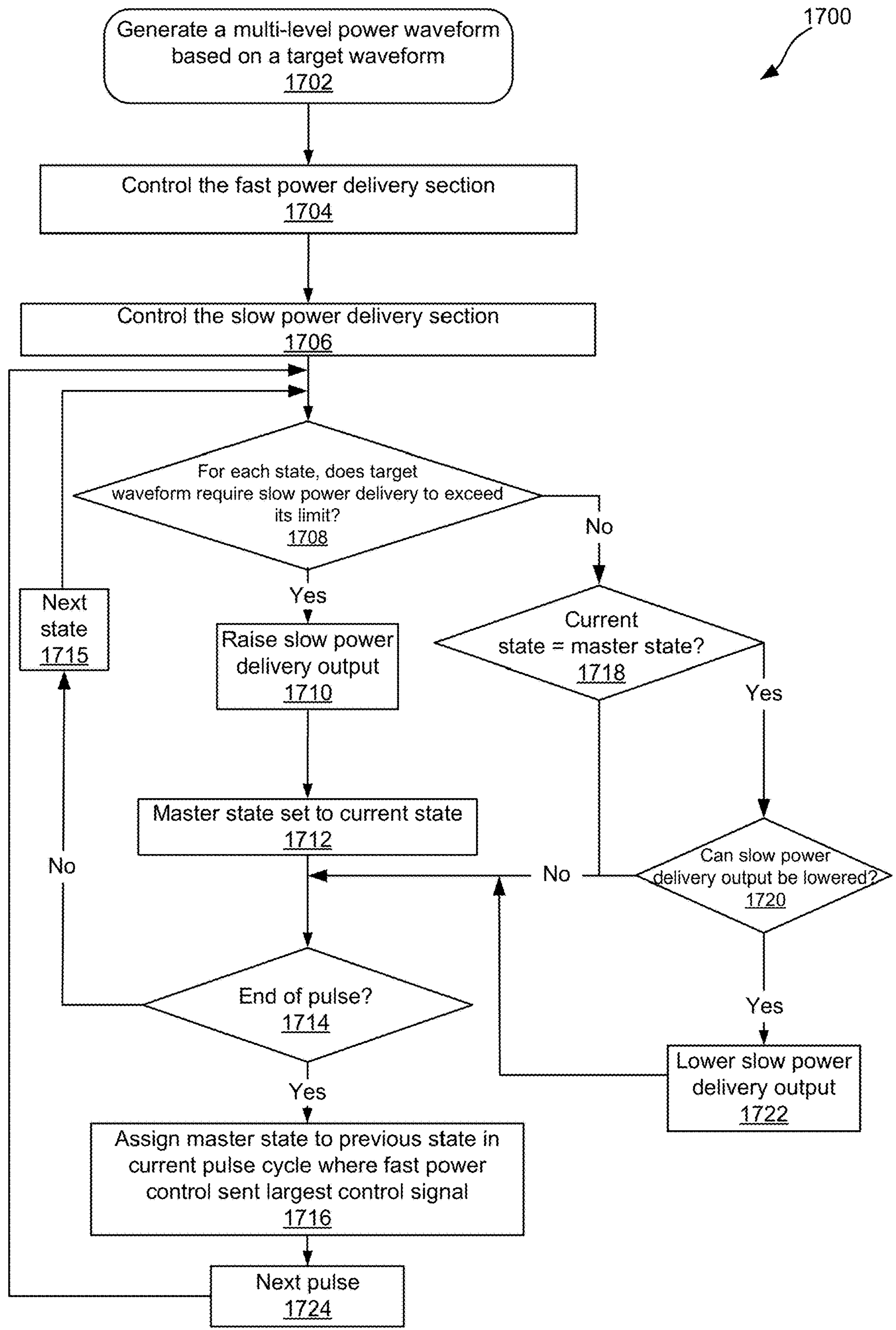
FIG. 17 illustrates another method of selecting a master state capable of lowering the slow control in the power generation system of FIG. 15.

While this disclosure has focused on a power generation and sensor 114 with a DC section 308 and a power amplifier 306, the herein disclosed controls can be applied to other systems. For instance, if one generalizes the rail control (316, 304, 308) as a "slow section" and the amplifier control (314, 302, 306) as a "fast section," then one can substitute/generalize "slow control" for 316, 304 and 308 and "fast control" for 314, 302, and 306 in FIG. 3. In other words, the DC section 308 could be replaced by any "slow power delivery section" and the RF amplifier 306 could be replaced by any "fast power delivery section." Similarly, the method 500 of FIG. 5 could be generalized to describe selection of a master state responsible for raising and lowering an output of the slow power delivery section. FIG. 15 illustrates a power generation system comprising a fast control section and a slow control section. FIGS. 16 and 17 illustrate corresponding methods of controlling the system of FIG. 15.

A target waveform is provided to a control section 1502, implemented, for instance, in an FPGA or other one or more processing components. The target waveform can be any arbitrary waveform and is not limited to pulsed waveforms such as that seen in FIG. 2. A power generation system 1504 attempts to provide an output waveform to a strongly nonlinear and/or chaotic load 1508 (e.g., a plasma load) that tracks the target waveform. The control section 1502 uses feedback from an output waveform of the power generation system 1504 to control the power generation system 1504 to track the target waveform. The power generation system 1504 can include a fast power delivery section 1514 and a slow power delivery section 1516. "Fast" and "slow" in this context are used to indicate a relative speed at which a component can track a control signal. For instance, the slow power delivery section 1516 may include inductive components that retard rapid changes in current. A component providing a rail voltage is an example of a slow power delivery section 1516 since rails typically do not change value quickly. On the other hand, the fast power delivery section 1514 may use a switching topology or other means, for example, to carry out rapid changes in current and/or voltage. A half- or full-bridge switching amplifier is one example of the fast power delivery section 1514. The fast and slow power delivery sections 1514, 1516 work together to generate the output waveform based on control signals from the control section 1502. The control section 1502 may include a separate control for each of the fast and slow power delivery sections 1514, 1516. For instance, a fast control 1510 may control the fast power delivery section 1514, and the slow control 1512 may control the slow power delivery section 1516. The fast and slow controls 1510, 1512 may work together to control aspects of the power generation 1504. For instance, the fast control 1510 may instruct the slow control 1512 to instruct the slow power delivery section 1516 to provide greater power to the fast delivery power section 1514 when the fast control 1510 recognizes that the fast power delivery section 1514 cannot provide sufficient power to track the target waveform at a given power level provided by the slow power delivery section 1516. However, it should be appreciated that while the slow power delivery section 1516 can provide power to the fast power delivery section 1514, in other embodiments, the fast power delivery section 1514 may provide power to the slow power delivery section 1516.

An algorithm can be implemented in the slow control 1512, as described in FIG. 16, that selects a master state, which is the only state that can lower the slow power delivery section 1516 output. Both the fast and slow control 1510, 1512 have a bias range of 0-100%. Assuming that the low power delivery section 1516 provides power to the fast power delivery section 1514, the slow control 1512 can assign a master state any time that the fast control 1510 instructs the slow control 1512 to raise a power level of the slow power delivery section 1516 (Block 1602). The slow control 1512 can also assign a master state at an end of any repeating sequence of power outputs (e.g., a pulse cycle) to a previous state calling for a highest fast power delivery section output for the current repeating sequence of power outputs (Block 1604). In some cases, the master state selected by Block 1604 will not differ from that selected by Block 1602. As power delivery progresses, if a state assigned the master state returns, then the slow control 1512 looks at whether the slow power delivery section 1516 can lower its output while still allowing the power generation 1504 to track to the target waveform for that state (Decision 1606). If so, then the slow control 1512 instructs the slow power delivery section 1516 to lower its output (Block 1608). These two master state selections 1602 and 1604 can then repeat until all repeating sequences of power outputs have completed (Decision 1610).

In an alternative, FIG. 17 shows another method to control the fast and slow power sections. The method 1700 focuses on decisions within a single pulse, but one of skill in the art can, without undue experimentation, extend this method 1700 to multiple pulse cycles. The method 1700 starts by generating a multi-level power waveform based on a target waveform using a fast power delivery section and deriving power from a fast power delivery section (Block 1702). RF power amplifier 306, and DC section 308, are non-limiting examples of the fast power delivery section and slow power delivery section discussed in the method 1700. The generated waveform has multiple pulse cycles, each pulse cycle having multiple repeating pulses, and each pulse having three or more states, each state having a different power level. The method 1700 further includes controlling the fast power delivery section (e.g., 306) with a control or drive or bias range (Block 1704). An upper limit of this range is illustrated for instance, as the dashed horizontal line in FIGS. 7C, 8C, 9C, 10C, 11C, 12C, and 13C, all around 5V. For instance, the controlling 1704 can be performed by controller 314 and driver 302. In addition to controlling the fast power delivery section, the method 1700 also controls the slow power delivery section (e.g., 308). For instance, the controlling 1706 can be performed by controller 316 and driver 304. Given these control parameters and the target waveform, the slow control 1512 raises the slow power delivery section 1516 (Block 1710) if the target waveform requires the fast power delivery section 1514 to exceed its output range (i.e., exceed the range of the fast control 1510) (Decision 1708=Yes). If such a condition exists (i.e., a state raises the rail voltage), then the method 1700 makes that state that raised the slow power delivery section 1516 output, the master state (Block 1712). The method 1700 then determines whether the current pulse is at an end (Decision 1714). If the target waveform could be met within the range of the fast power delivery section 1514 (i.e., within the range of the fast control 1510) (Decision 1708=No), then no changes to the slow power delivery section 1516 or master state occur. However, for each state, the method 1700 checks to see if a current state is the master state (Decision 1718), and if so, allows the current state to lower the slow power delivery section 1516 output if possible (Decision 1720). If both conditions are not met (Decision 1720=No), then the method 1700 determines if the current pulse has ended (Decision 1714). If both conditions are met (Decision 1720=Yes), then the slow control 1512 instructs the slow power delivery section 1516 to lower its output (Block 1722) and then the method 1700 determines if the current pulse has ended (Decision 1714).

Whichever path brings the method 1700 to the determination of pulse ending (Decision 1714), if the pulse has not ended, then the method 1700 moves to a next state (Block 1715). If the pulse has ended, then the method 1700 assigns the master state to a previous state in a current one of the multiple pulse cycles having the greatest fast power delivery section 1514 control signal (Block 1716) and proceeds to the next pulse (Decision 1724).

For the purposes of this disclosure, a nonlinear plasma load can be weakly nonlinear, strongly nonlinear, and/or chaotic. Traditional feedback systems are inoperable relative to strongly nonlinear and/or chaotic loads.

Figure 14:
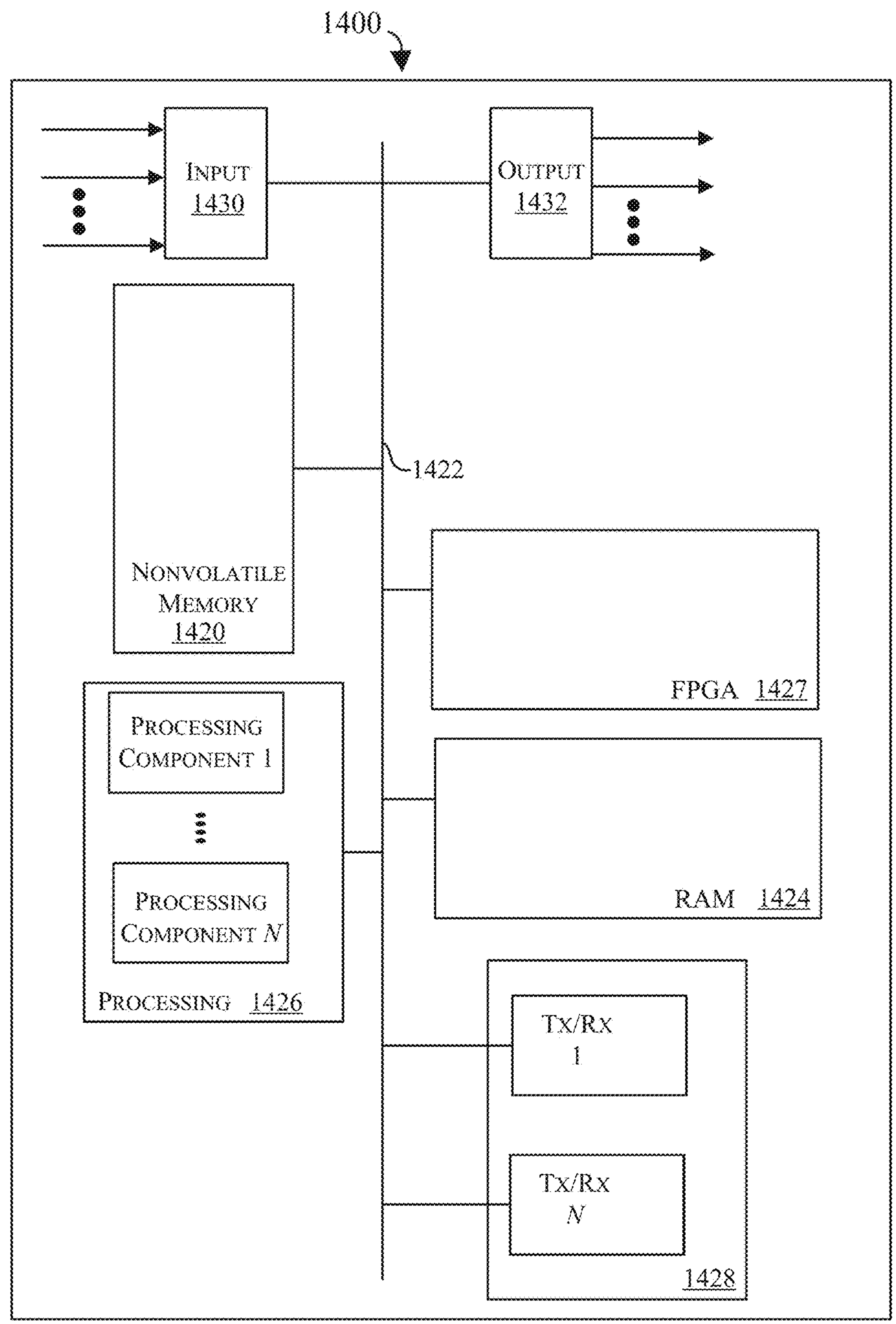
FIG. 14 illustrates a block diagram of a computing implementation that can be used to carry out the functionality of methods 500 and 600 and/or the functionality of controllers 314 and 316.

The methods described in connection with the embodiments disclosed herein may be embodied directly in hardware, in processor-executable code encoded in a non-transitory tangible processor readable storage medium, or in a combination of the two. Referring to FIG. 14 for example, shown is a block diagram depicting physical components that may be utilized to realize the controller 112 (and the control section 112 generally) according to an exemplary embodiment. As shown, in this embodiment nonvolatile memory 1420 is coupled to a bus 1422 that is also coupled to random access memory ("RAM") 1424, a processing portion (which includes N processing components) 1426, a field programmable gate array (FPGA) 1427, and a transceiver component 1428 that includes N transceivers. None of these components are required, and any combination of these may be included in the device 1400. For instance, where an FPGA 1427 is implemented, the processing portion 1426 may not be used, and vice versa. Although the components depicted in FIG. 14 represent physical components, FIG. 14 is not intended to be a detailed hardware diagram; thus, many of the components depicted in FIG. 14 may be realized by common constructs or distributed among additional physical components. Moreover, it is contemplated that other existing and yet-to-be developed physical components and architectures may be utilized to implement the functional components described with reference to FIG. 14.

In general, the nonvolatile memory 1420 is non-transitory memory that functions to store (e.g., persistently store) data and processor-executable code (including executable code that is associated with effectuating the methods described herein). In some embodiments for example, the nonvolatile memory 1420 includes bootloader code, operating system code, file system code, and non-transitory processor-executable code to facilitate the execution of a method to select a master state and thereby more effectively control raising and lowering of the rail voltage of the DC section 308 described with reference to FIGS. 5 and 6 described further herein.

In many implementations, the nonvolatile memory 1420 is realized by flash memory (e.g., NAND or ONENAND memory), but it is contemplated that other memory types may be utilized as well. Although it may be possible to execute the code from the nonvolatile memory 1420, the executable code in the nonvolatile memory is typically loaded into RAM 1424 and executed by one or more of the N processing components in the processing portion 1426.

The N processing components in connection with RAM 1424 generally operate to execute the instructions stored in nonvolatile memory 1420 to enable a method to select a master state and thereby more effectively control raising and lowering of the rail voltage. For example, non-transitory, processor-executable code to effectuate the methods described with reference to FIGS. 5 and 6 may be persistently stored in nonvolatile memory 1420 and executed by the N processing components in connection with RAM 1424. As one of ordinarily skill in the art will appreciate, the processing portion 1426 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 1426 may be configured to effectuate one or more aspects of the methodologies described herein (e.g., the method to select a master state and thereby more effectively control raising and lowering of the rail voltage of the DC section 308 as described in FIGS. 5 and 6). For example, non-transitory processor-readable instructions may be stored in the nonvolatile memory 1420 or in RAM 1424 and when executed on the processing portion 1426, cause the processing portion 1426 to perform a method of controlling the DC/rail driver 304 and the RF driver 302. Alternatively, non-transitory FPGA-configuration-instructions may be persistently stored in nonvolatile memory 1420 and accessed by the processing portion 1426 (e.g., during boot up) to configure the hardware-configurable portions of the processing portion 1426 to effectuate the functions of the controller 312 and/or the controllers 314, 316.

Alternatively, the FPGA 1427 may include non-transitory processor-executable code to facilitate the execution of a method to select a master state and thereby more effectively control raising and lowering of the rail voltage of the DC section 308 described with reference to FIGS. 5 and 6 described further herein. The FPGA 1427 may include on-board memory to access data such as the target multi-level waveform, or may access off-chip memory such as the nonvolatile memory 1420 accessible via bus 1422.

The input component 1430 operates to receive signals (e.g., feedback from the sensor 310 and/or signals from the user interface 108 such as the target multi-level pulsed waveform) that are indicative of one or more aspects of the target waveform or conditions of the nonlinear plasma load 104. The signals received at the input component may include, for example, a measurement of power delivered to the plasma processing chamber. The output component generally operates to provide one or more analog or digital signals to effectuate an operational aspect of the controllers 312, 314, 316 or the control section 112 generally. For example, the output portion 1432 may provide the controller signal to the RF driver 302 or the control signal to the DC/rail driver 304 described with reference to FIG. 3.

The depicted transceiver component 1428 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A generator comprising:
- a control section comprising:
  - an RF driver;
  - an RF controller;
  - a DC driver; and
  - a DC controller;
- a power generation section coupled to and configured to receive control signals from the control section, the power generation section comprising:
  - a DC section;
  - an RF power amplifier coupled to and configured to receive a variable rail voltage from the DC section; and
  - an output of the generator configured for coupling to a plasma processing chamber and delivering RF power to a nonlinear plasma load, wherein
  - the RF controller and the DC controller comprise one or more processing portions, one or more memories, and one or more modules stored on the one or more memories and executable on the one or more processing portions to:
    - for each state in an n-level waveform, raise the variable rail voltage if a target waveform requires a drive voltage of the RF power amplifier to equal or exceed a drive voltage threshold stored in the one or more memories, and make any state that causes the output of the DC section to rise, to become a master state;
    - at an end of each pulse, assign the master state to a previous state in a current pulse cycle of the target waveform having a greatest drive voltage of the RF power amplifier; and
    - for each state, check to see if a current state is the master state, and if so, instruct the DC section to lower its output if possible.

2. The generator of claim 1, wherein the possibility of the DC section lowering its output depends on whether the target waveform can be met with a lower DC section output and while keeping the drive voltage of the RF power amplifier below the drive voltage threshold.

3. The generator of claim 1, wherein the control section comprises a proportional-integral-derivative (PID)-based controller, and an amount that the variable rail voltage is raised or lowered is controlled by the proportional-integral-derivative (PID)-based controller.

4. The generator of claim 1, wherein the drive voltage for the first state of each pulse cycle is equal to a drive voltage for a last state of a previous pulse cycle.

5. The generator of claim 1, wherein the variable rail voltage is not lowered during a first pulse in each of the multiple pulse cycles unless the variable rail voltage is raised and lowered within a single state.

6. A method comprising:
- generating a multi-level power waveform based on a target waveform using an RF power amplifier with a variable output and deriving power from a DC section providing a variable rail voltage, the generated waveform having multiple pulse cycles, each pulse cycle having multiple repeating pulses, and each pulse having three or more states, each state having a different power level;
- controlling the RF power amplifier with a drive voltage having a range of 0V to a drive voltage threshold;
- for each state, raising the variable rail voltage if the target waveform requires the drive voltage to equal or exceed the drive voltage threshold, and make any state that causes the variable rail voltage to rise to become a master state;
- at an end of each pulse, assigning the master state to a previous state in a current one of the multiple pulse cycles having the greatest drive voltage; and
- for each state, checking to see if a current state is the master state, and if so, allow that state to lower the variable rail voltage if the variable rail voltage can be lowered.

7. The method of claim 6, wherein lowering the variable rail voltage is possible when target waveform can be achieved with the lower variable rail voltage and when the drive voltage remains below the drive voltage threshold.

8. The method of claim 6, wherein an amount that the variable rail voltage is raised or lowered is controlled by a proportional-integral-derivative (PID)-based controller.

9. The method of claim 6, wherein the master state for a first state of each of the multiple pulse cycles is arbitrarily selected.

10. The method of claim 9, wherein the drive voltage for the first state of each of the multiple pulse cycles is equal to the drive voltage for the last state of the previous pulse cycle.

11. The method of claim 6, wherein the variable rail voltage is not lowered during a first pulse in each of the multiple pulse cycles unless the variable rail voltage is raised and lowered within a single state.

12. A non-transitory, tangible computer readable storage medium, encoded with processor readable instructions to perform a method for generating a multi-level pulsed waveform, the method comprising:
- receiving a multi-level target waveform having multiple pulse cycle each having multiple repeating pulses and each pulse having three or more states;
- for each state, raising a rail voltage if the target waveform for that state calls for more power than can be achieved at a current value of the rail voltage, and assigning a master state to any state that causes the raising of the rail voltage;

at an end of each of the multiple repeating pulses, assigning the master state to a previous state in a current one of the multiple pulse cycles that used a greatest drive voltage; and generating a multi-level pulsed output waveform, wherein the master state has sole authority to lower the rail voltage.

13. The non-transitory, tangible computer readable storage medium of claim 12, wherein the raising the rail voltage is implemented in a DC section configured to provide the rail voltage to a power amplifier.

14. The non-transitory, tangible computer readable storage medium of claim 13, wherein the drive voltage controls the power amplifier.

15. The non-transitory, tangible computer readable storage medium of claim 12, further comprising maintaining the drive voltage at a same level between a last state of one of the multiple pulse cycles and a first state of a next one of the multiple pulse cycle.

16. The non-transitory, tangible computer readable storage medium of claim 12, further comprising raising, but not lowering, the rail voltage during a first pulse in each of the multiple pulse cycles.

* * * * *